US012642142B2

(12) United States Patent
Chang

(10) Patent No.: US 12,642,142 B2
(45) Date of Patent: May 26, 2026

(54) METHOD OF FORMING A SEMICONDUCTOR STRUCTURE INCLUDING BONDING A PLURALITY OF FIRST SEMICONDUCTOR DIES TO A PLURALITY OF SECOND SEMICONDUCTOR DIES

(71) Applicant: Taiwan Semiconductor Manufacturing Company, Ltd., Hsinchu (TW)

(72) Inventor: Jen-Yuan Chang, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 511 days.

(21) Appl. No.: 18/169,337

(22) Filed: Feb. 15, 2023

(65) Prior Publication Data

US 2024/0063185 A1 Feb. 22, 2024

Related U.S. Application Data

(60) Provisional application No. 63/373,161, filed on Aug. 22, 2022.

(51) Int. Cl.
H01L 25/065 (2023.01)
H01L 21/56 (2006.01)
(Continued)

(52) U.S. Cl.
CPC ........ H01L 25/0657 (2013.01); H01L 21/561 (2013.01); H01L 23/3121 (2013.01); (Continued)

(58) Field of Classification Search
CPC ... H01L 21/561; H01L 24/96; H01L 25/0657; H01L 2221/68368; H01L 25/561; H01L 2221/68327; H01L 2224/32145
See application file for complete search history.

(56) References Cited

U.S. PATENT DOCUMENTS 8,802,504 B1 8/2014 Hou et al.
8,803,292 B2 8/2014 Chen et al.
(Continued)

FOREIGN PATENT DOCUMENTS

TW 202133282 A 9/2021

*Primary Examiner* — Khiem D Nguyen
(74) *Attorney, Agent, or Firm* — Haynes and Boone, LLP

(57) ABSTRACT

A semiconductor structure and a method of manufacturing a semiconductor structure are provided. First semiconductor dies are formed from a first substrate, each of the first semiconductor die including an interconnect structure having a first dielectric material. A first thinning operation is performed on each of the first semiconductor dies. Second semiconductor dies are formed from a second substrate. The first semiconductor dies are bonded to a third substrate. A first gap between the first semiconductor dies is filled with a second dielectric material. The second semiconductor dies are bonded to the first semiconductor dies through a second bonding film, each of the first semiconductor dies electrically connected to each of the corresponding second semiconductor dies. A second gap between the second semiconductor dies is filled with a third dielectric material, at least one of the second and third dielectric materials different from the first dielectric material.

20 Claims, 44 Drawing Sheets

(51) Int. Cl.

| | |
|---|---|
| *H01L 23/00* | (2006.01) |
| *H01L 23/31* | (2006.01) |
| *H01L 23/48* | (2006.01) |
| *H01L 25/00* | (2006.01) |

(52) U.S. Cl.

CPC ............ *H01L 23/481* (2013.01); *H01L 24/16* (2013.01); *H01L 24/29* (2013.01); *H01L 24/32* (2013.01); *H01L 24/96* (2013.01); *H01L 25/50* (2013.01); *H01L 2224/16227* (2013.01); *H01L 2224/29186* (2013.01); *H01L 2224/32145* (2013.01); *H01L 2224/32225* (2013.01); *H01L 2224/73204* (2013.01); *H01L 2224/96* (2013.01)

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2004/0070083 | A1* | 4/2004 | Su ....................... H01L 25/0657 257/E25.023 |
| 2004/0217485 | A1* | 11/2004 | Chung ................... H01L 24/73 257/E23.101 |
| 2014/0026431 | A1* | 1/2014 | Nah ................... H01L 25/0657 33/562 |
| 2014/0091447 | A1* | 4/2014 | Onozuka ................. H01L 24/82 257/676 |
| 2015/0200179 | A1* | 7/2015 | Do .......................... H01L 24/16 438/126 |
| 2016/0276238 | A1* | 9/2016 | Lin .......................... H01L 24/96 |
| 2020/0321291 | A1* | 10/2020 | Grivna .................. H01L 23/585 |
| 2021/0242117 | A1 | 8/2021 | Hung et al. |
| 2021/0407941 | A1* | 12/2021 | Haba ...................... H01L 24/08 |
| 2022/0216153 | A1* | 7/2022 | Hou ........................ H01L 24/11 |

* cited by examiner

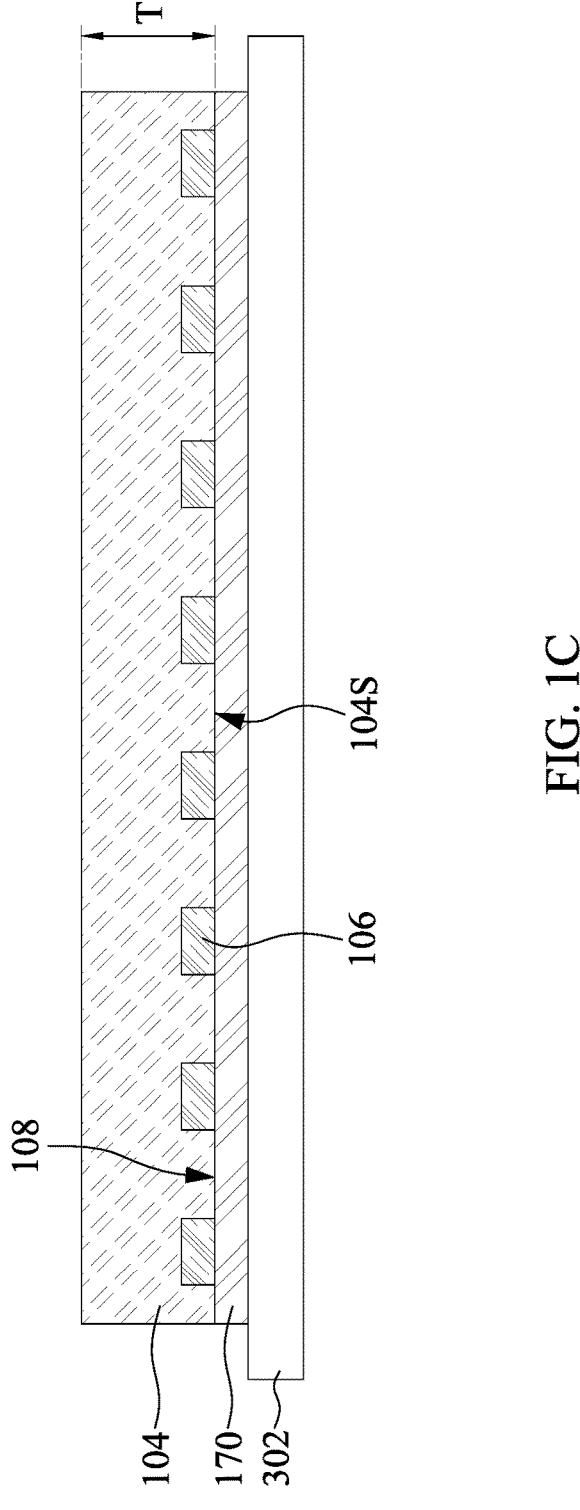
FIG. 1C

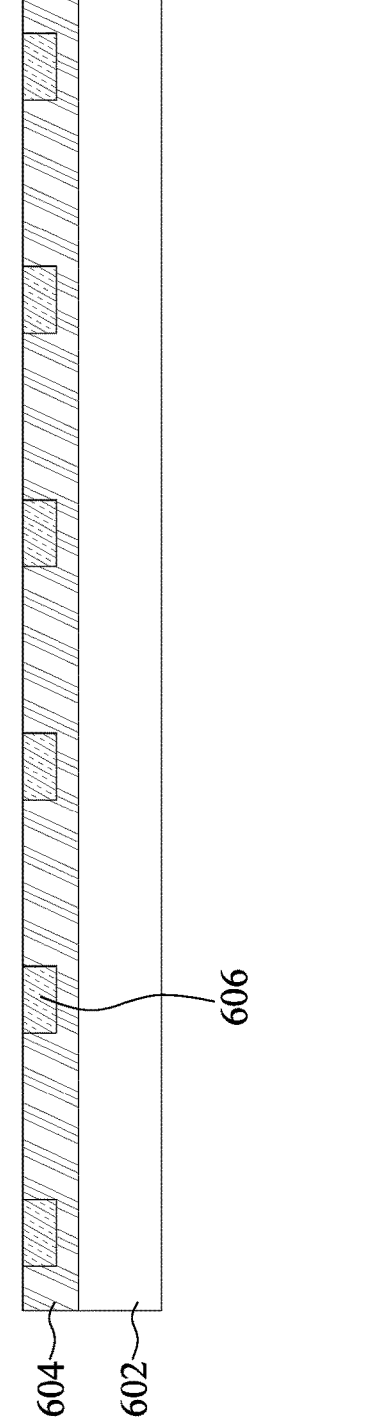
FIG. 1F

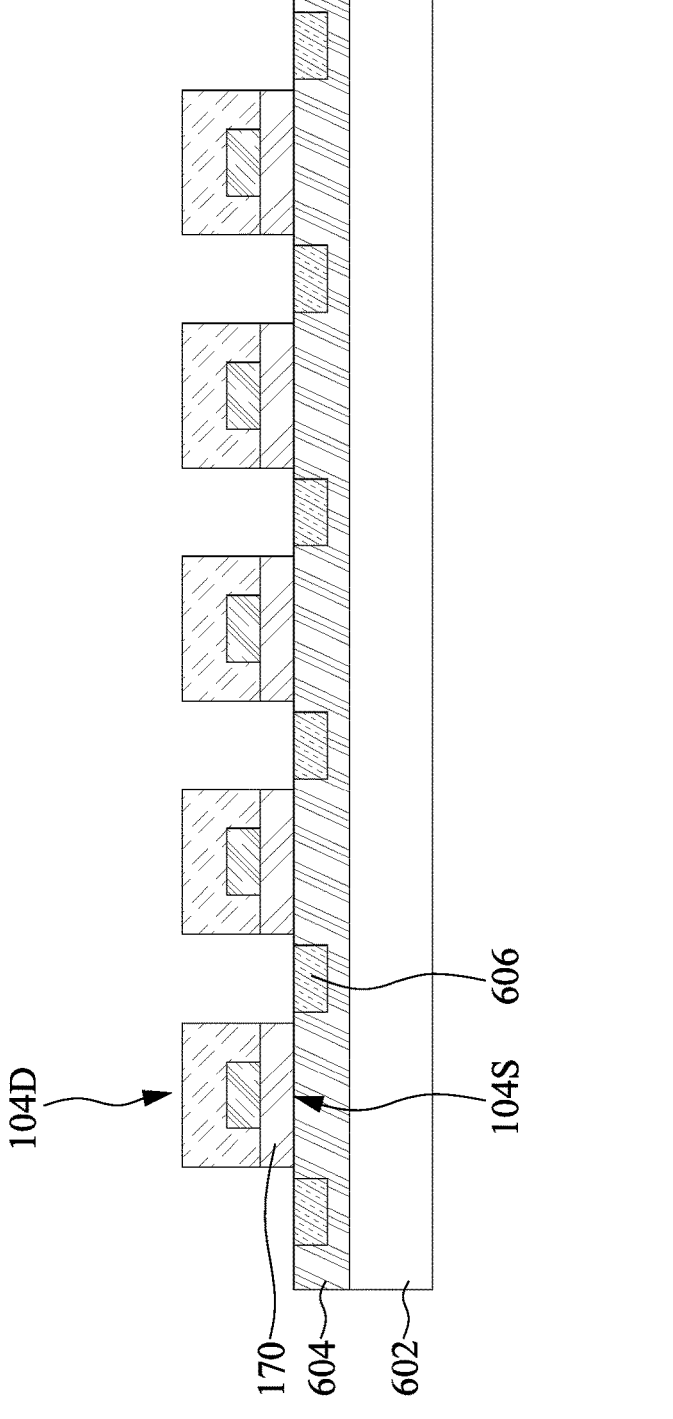
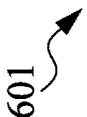
FIG. 1G

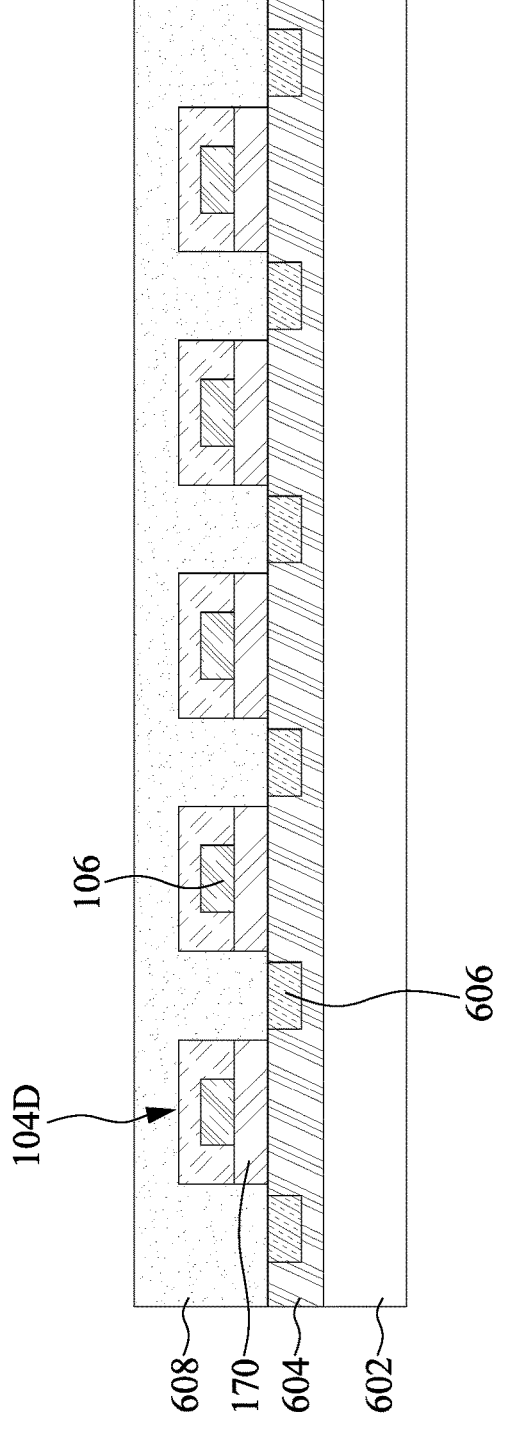
FIG. 1K

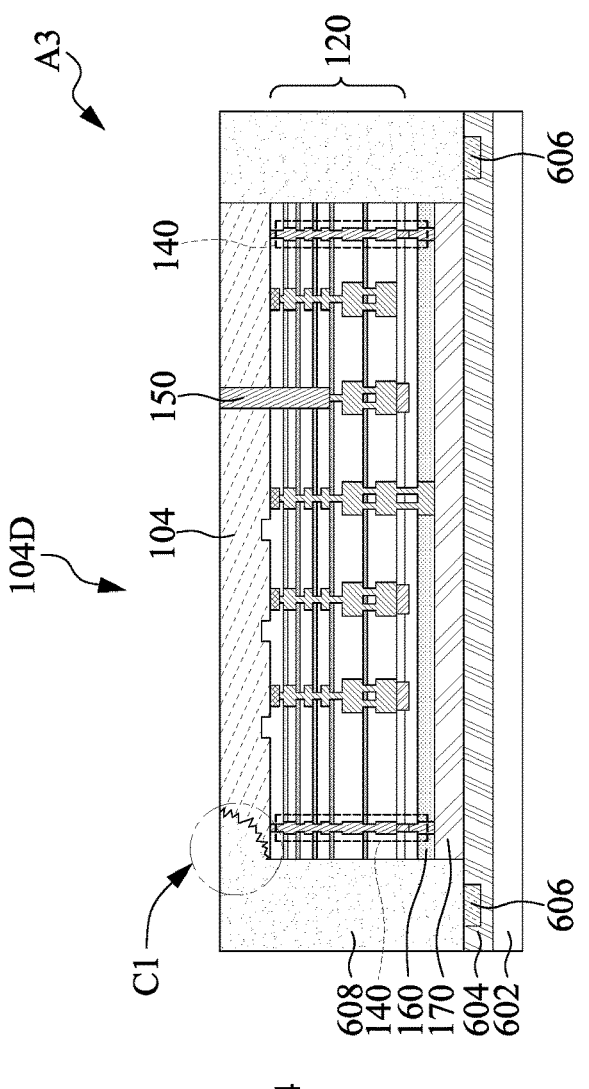
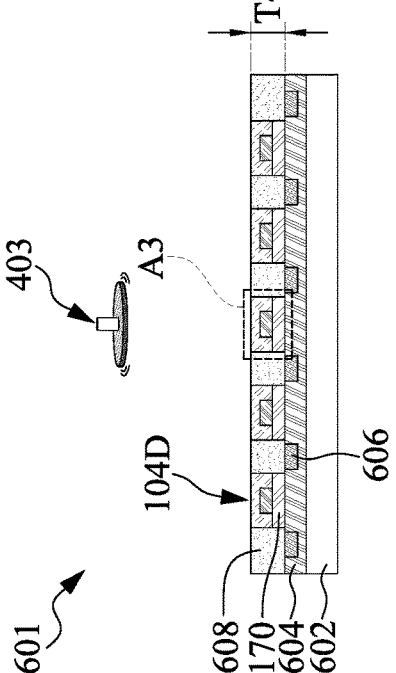
FIG. 1L

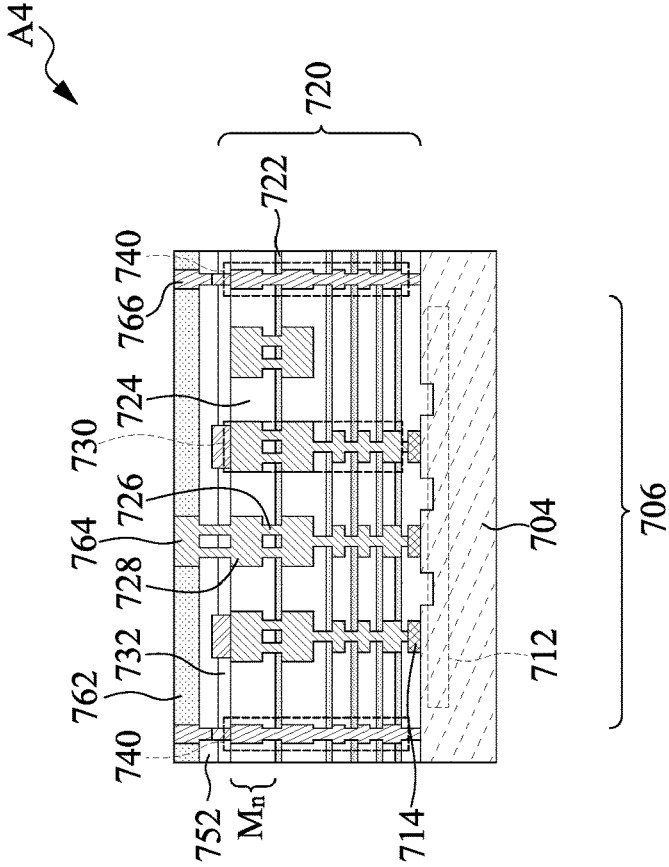
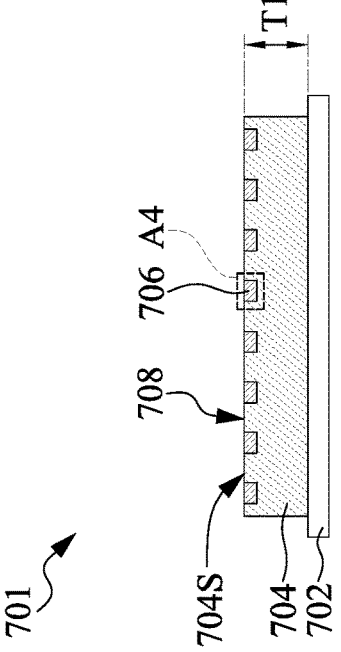
FIG. 1M 701
404
T2
706
704
703
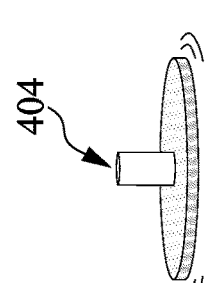
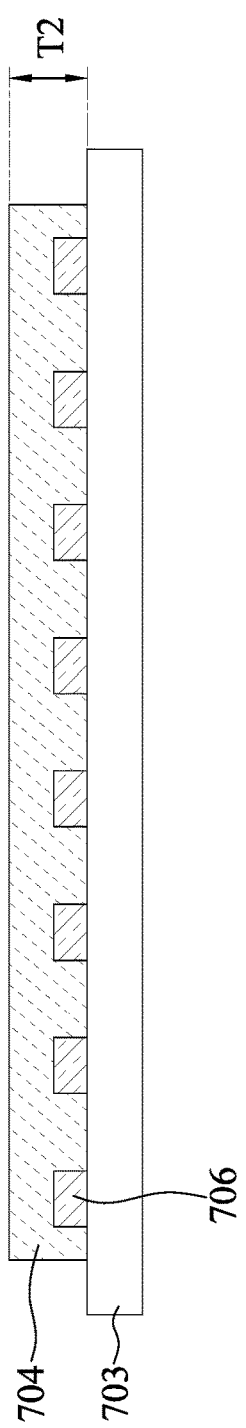
FIG. 1N

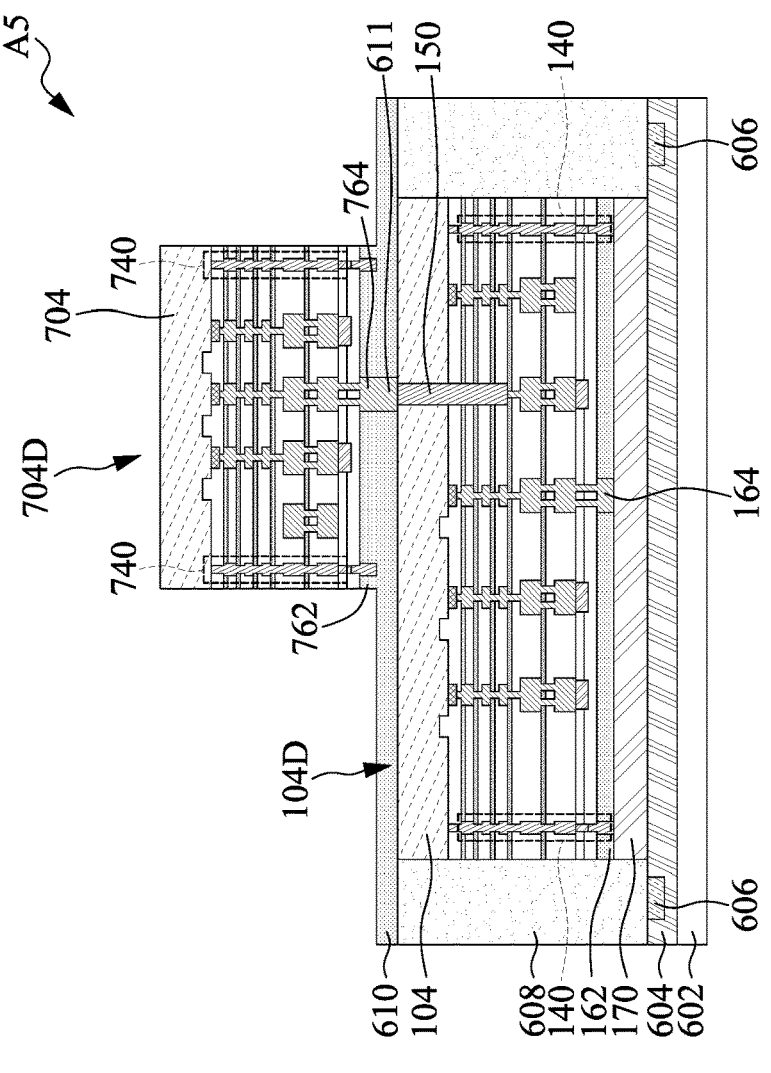
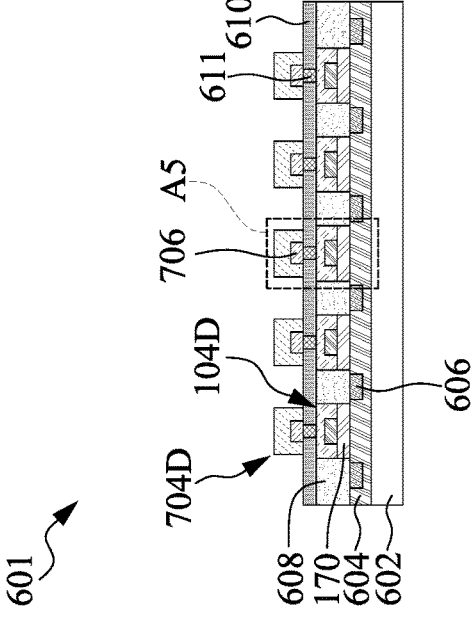
FIG. 1Q

FIG. 1R

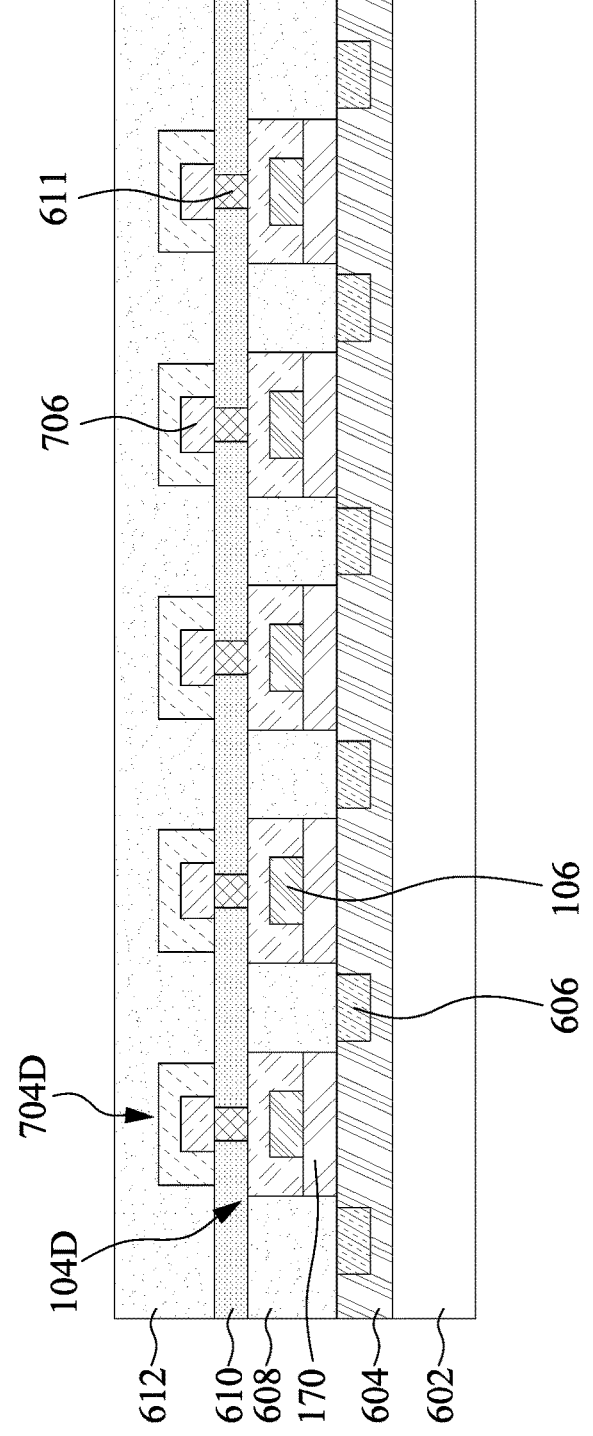
FIG. 1S

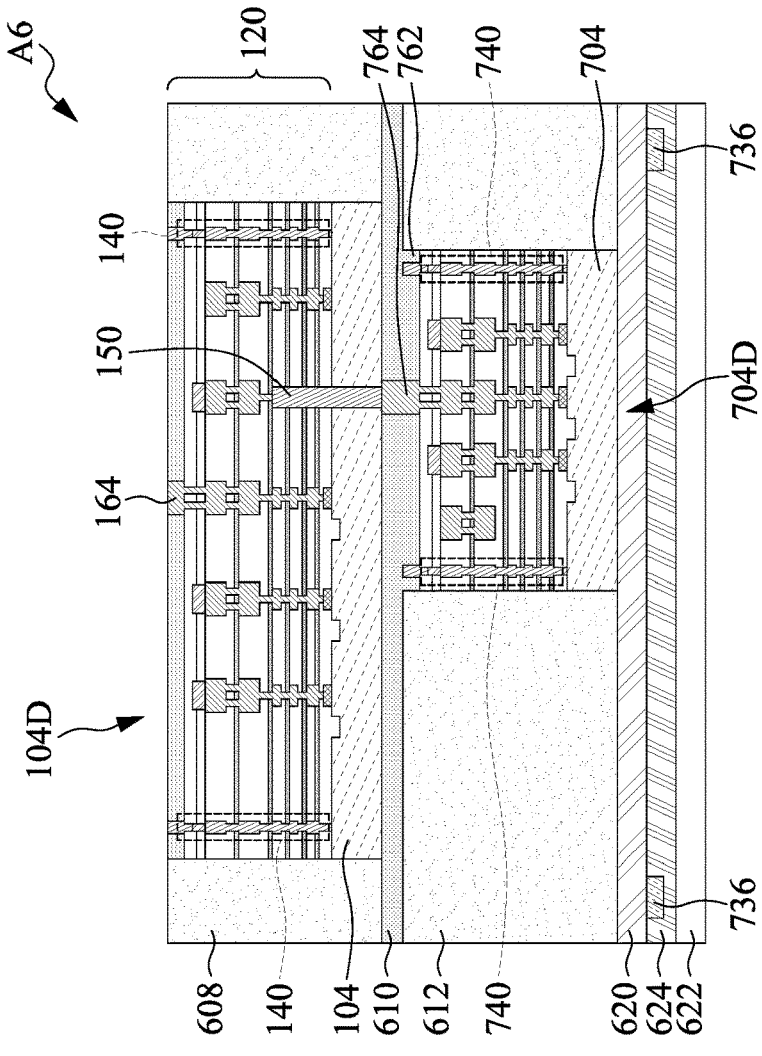
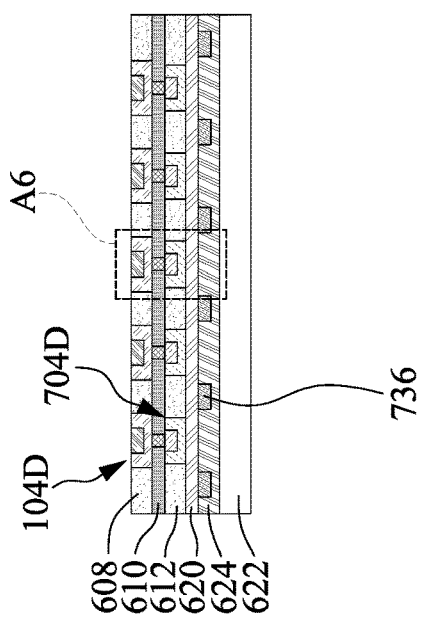
FIG. 1U

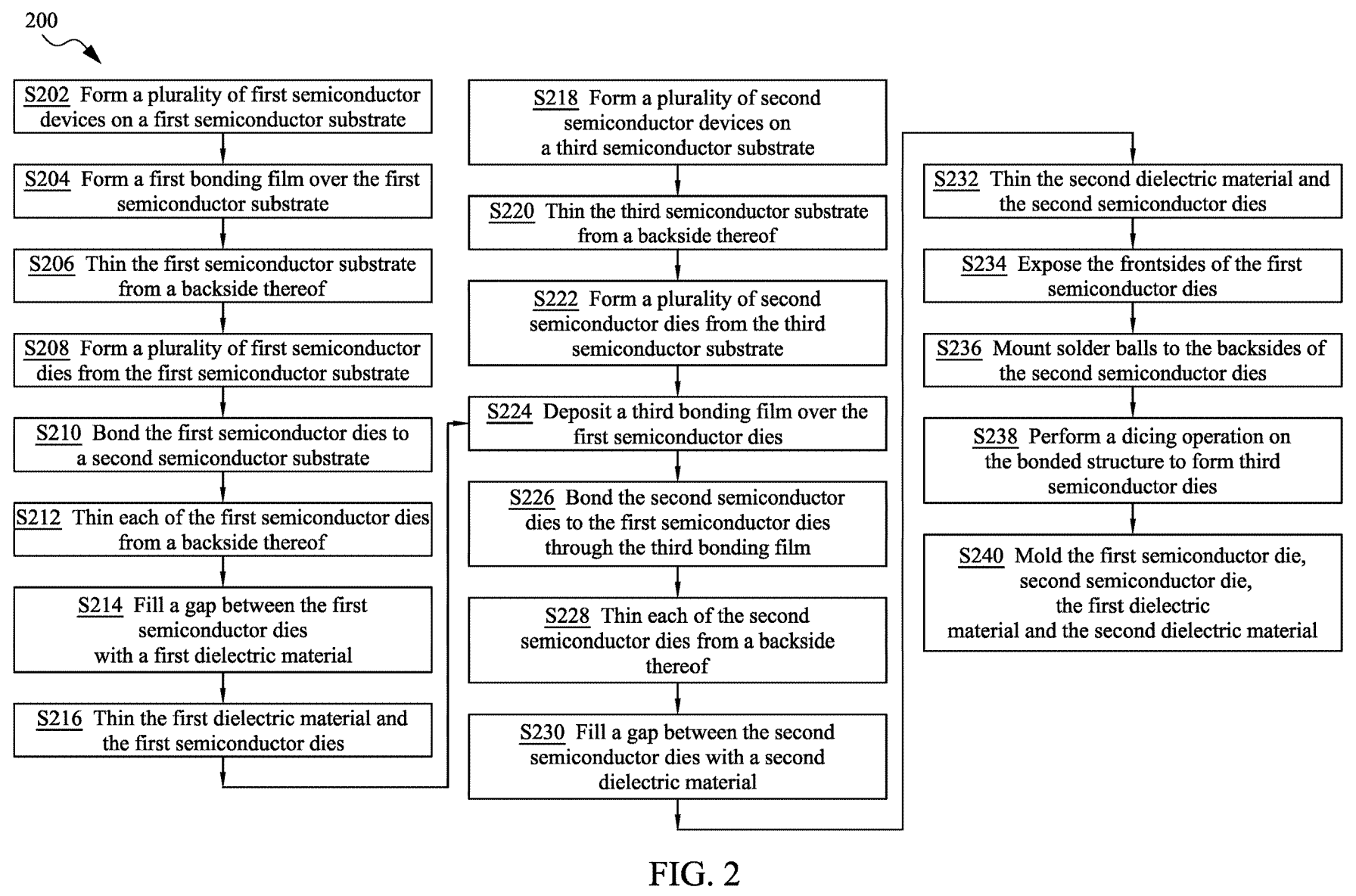

200

S202  Form a plurality of first semiconductor devices on a first semiconductor substrate S204  Form a first bonding film over the first semiconductor substrate S206  Thin the first semiconductor substrate from a backside thereof S208  Form a plurality of first semiconductor dies from the first semiconductor substrate S210  Bond the first semiconductor dies to a second semiconductor substrate S212  Thin each of the first semiconductor dies from a backside thereof S214  Fill a gap between the first semiconductor dies with a first dielectric material S216  Thin the first dielectric material and the first semiconductor dies S218  Form a plurality of second semiconductor devices on a third semiconductor substrate S220  Thin the third semiconductor substrate from a backside thereof S222  Form a plurality of second semiconductor dies from the third semiconductor substrate S224  Deposit a third bonding film over the first semiconductor dies S226  Bond the second semiconductor dies to the first semiconductor dies through the third bonding film S228  Thin each of the second semiconductor dies from a backside thereof S230  Fill a gap between the second semiconductor dies with a second dielectric material S232  Thin the second dielectric material and the second semiconductor dies S234  Expose the frontsides of the first semiconductor dies S236  Mount solder balls to the backsides of the second semiconductor dies S238  Perform a dicing operation on the bonded structure to form third semiconductor dies S240  Mold the first semiconductor die, second semiconductor die, the first dielectric material and the second dielectric material

FIG. 2

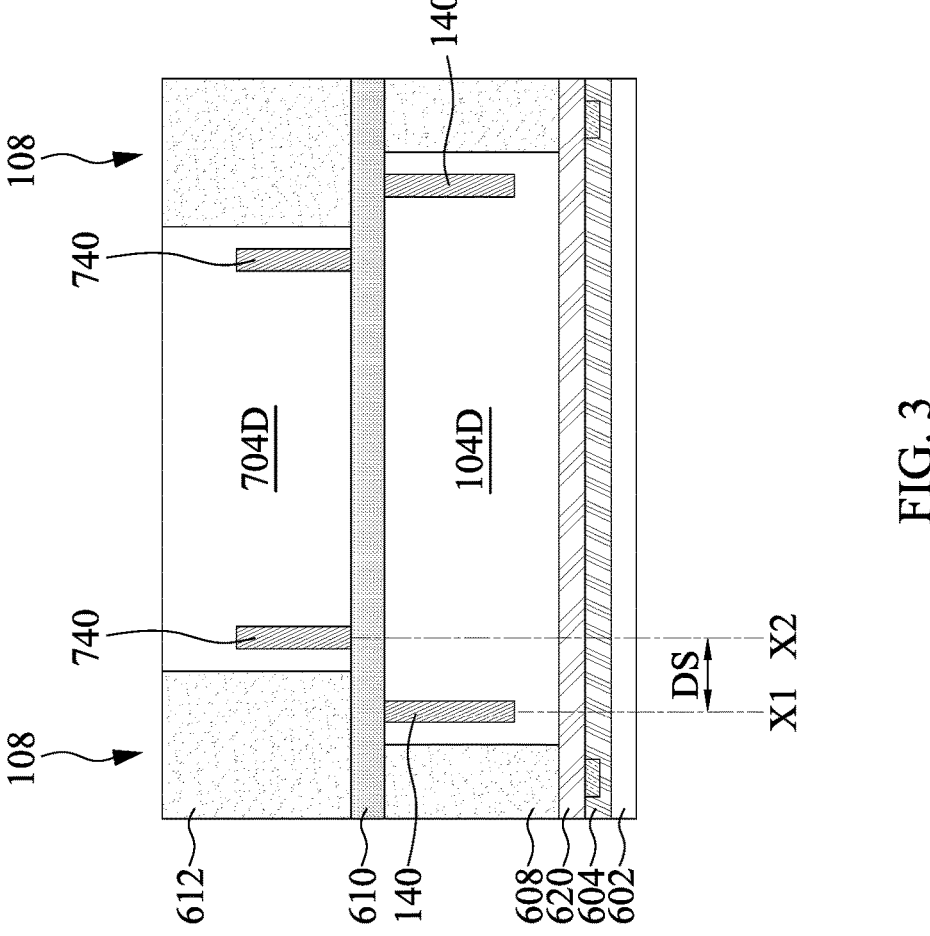
FIG. 3

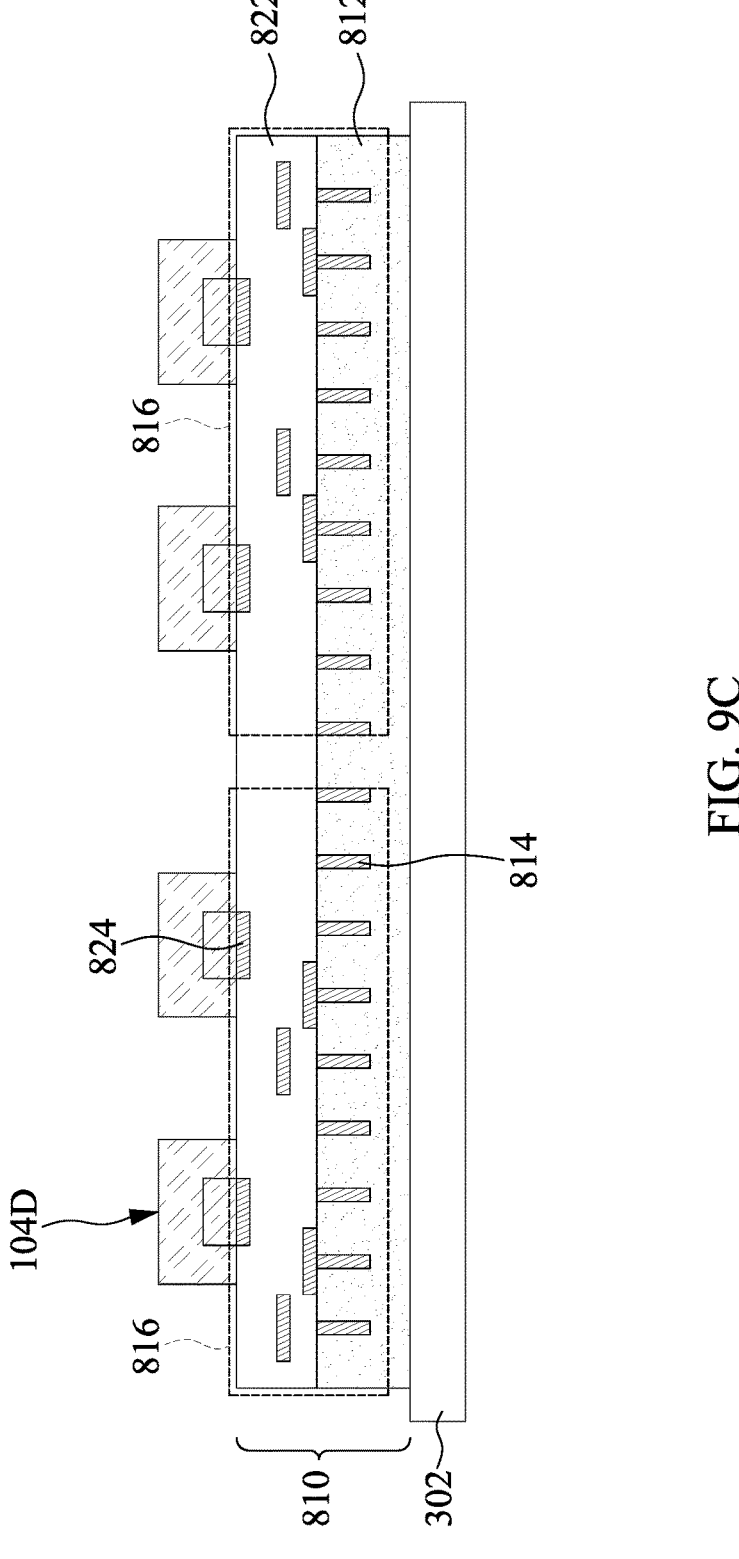
FIG. 9C

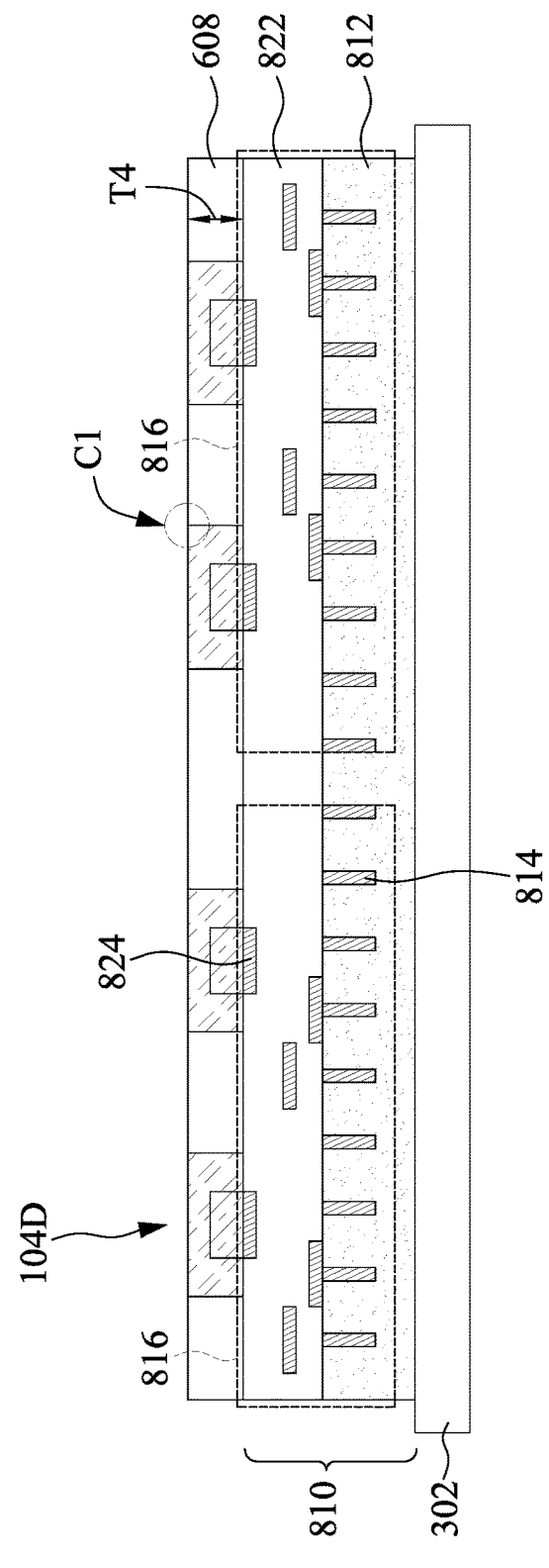
FIG. 9E

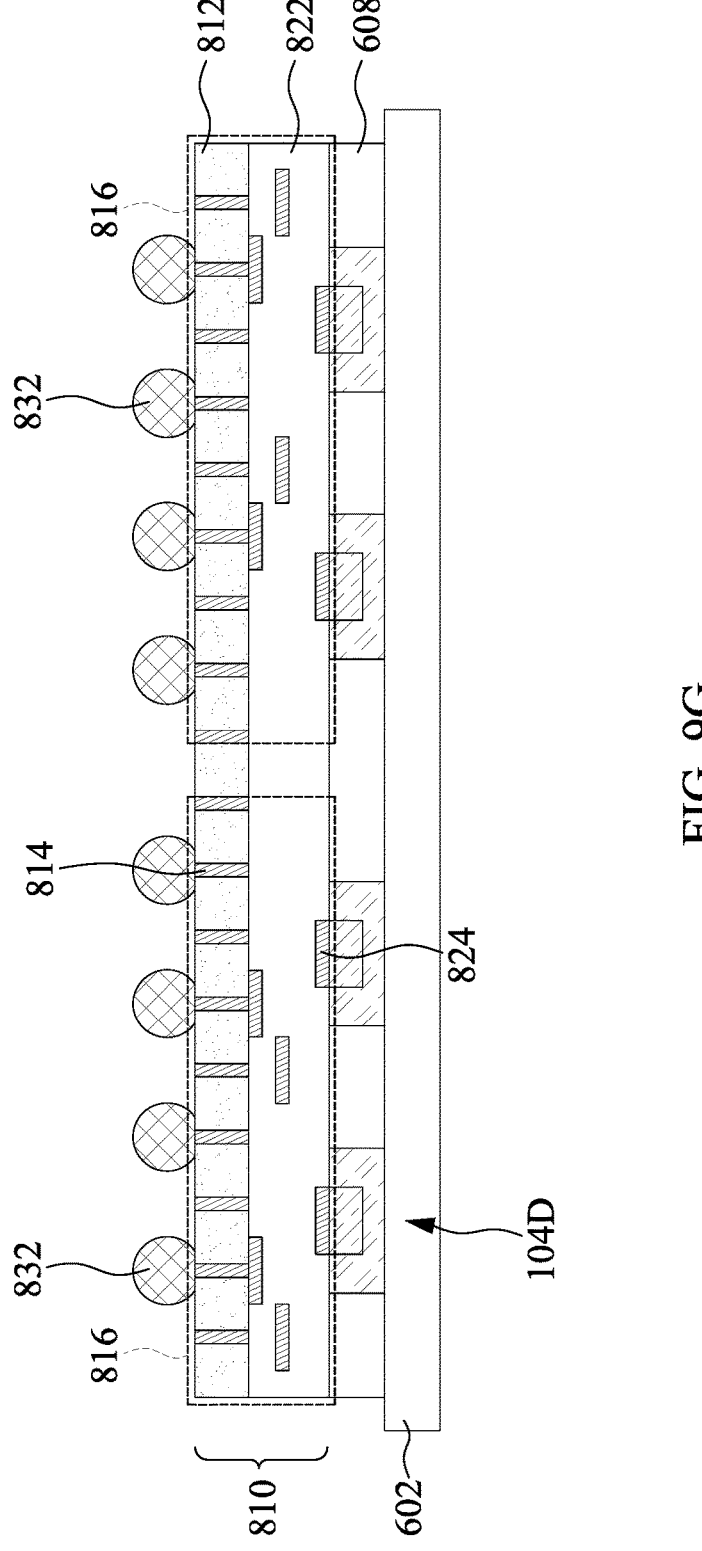
FIG. 9G

1000

S202 — Form a plurality of first semiconductor devices on a first semiconductor substrate S204 — Form a first bonding film over the first semiconductor substrate S206 — Thin the first semiconductor substrate from a backside thereof S208 — Form a plurality of first semiconductor dies from the first semiconductor substrate S1002 — Form a plurality of interposer devices on a second semiconductor substrate S1004 — Bond the first semiconductor dies to the second semiconductor substrate S1006 — Thin each of the first semiconductor dies from a backside thereof S1008 — Fill a gap between the first semiconductor dies with a first dielectric material S1010 — Thin the first semiconductor dies from backsides thereof S1012 — Expose the backside of the second semiconductor substrate S1014 — Mount solder balls to the backside of the second semiconductor substrate S1016 — Perform a dicing operation on the bonded structure S1018 — Mold the first semiconductor dies, the interposer die and the first dielectric material

FIG. 10

METHOD OF FORMING A SEMICONDUCTOR STRUCTURE INCLUDING BONDING A PLURALITY OF FIRST SEMICONDUCTOR DIES TO A PLURALITY OF SECOND SEMICONDUCTOR DIES

PRIORITY CLAIM AND CROSS-REFERENCE

This application claims priority to U.S. Provisional Application Ser. No. 63/373,161, filed Aug. 22, 2022, the disclosure of which is hereby incorporated by reference in its entirety.

BACKGROUND

Electronic equipment involving semiconductor devices is essential for many modern applications. Technological advances in materials and design have produced generations of semiconductor devices, in which each generation includes smaller and more complex circuits than the previous generation. Among the various advanced semiconductor technologies, the system on integrated chip (SoIC) technology has attracted a lot of attention due to its reduced bond pad pitch and greater system performance. However, there are still many problems that should be resolved to improve SoIC devices, e.g., the reliability issue. Therefore, there is a need to develop new methods and structures for enhancing the reliability of SoIC devices.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIGS. 1A, 1B, 1C, 1D, 1E, 1F, 1G, 1H, 1I, 1J, 1K, 1L, 1M, 1N, 1O, 1P, 1Q, 1R, 1S, 1T, 1U, 1V, 1W, 1X, and 1Y are schematic cross-sectional views showing intermediate stages in a method of forming a semiconductor structure, in accordance with various embodiments of the present disclosure.

FIG. 2 is a schematic flowchart of a method of manufacturing the semiconductor structure shown in FIGS. 1A to 1Y, in accordance with some embodiments.

FIG. 3 is a schematic cross-sectional view of a semiconductor structure, in accordance with some embodiments.

FIGS. 9A, 9B, 9C, 9D, 9E, 9F, 9G, 9H, and 9I are schematic cross-sectional views showing various stages in a method of forming a semiconductor structure, in accordance with various embodiments of the present disclosure.

DETAILED DESCRIPTION

Figure 1A:
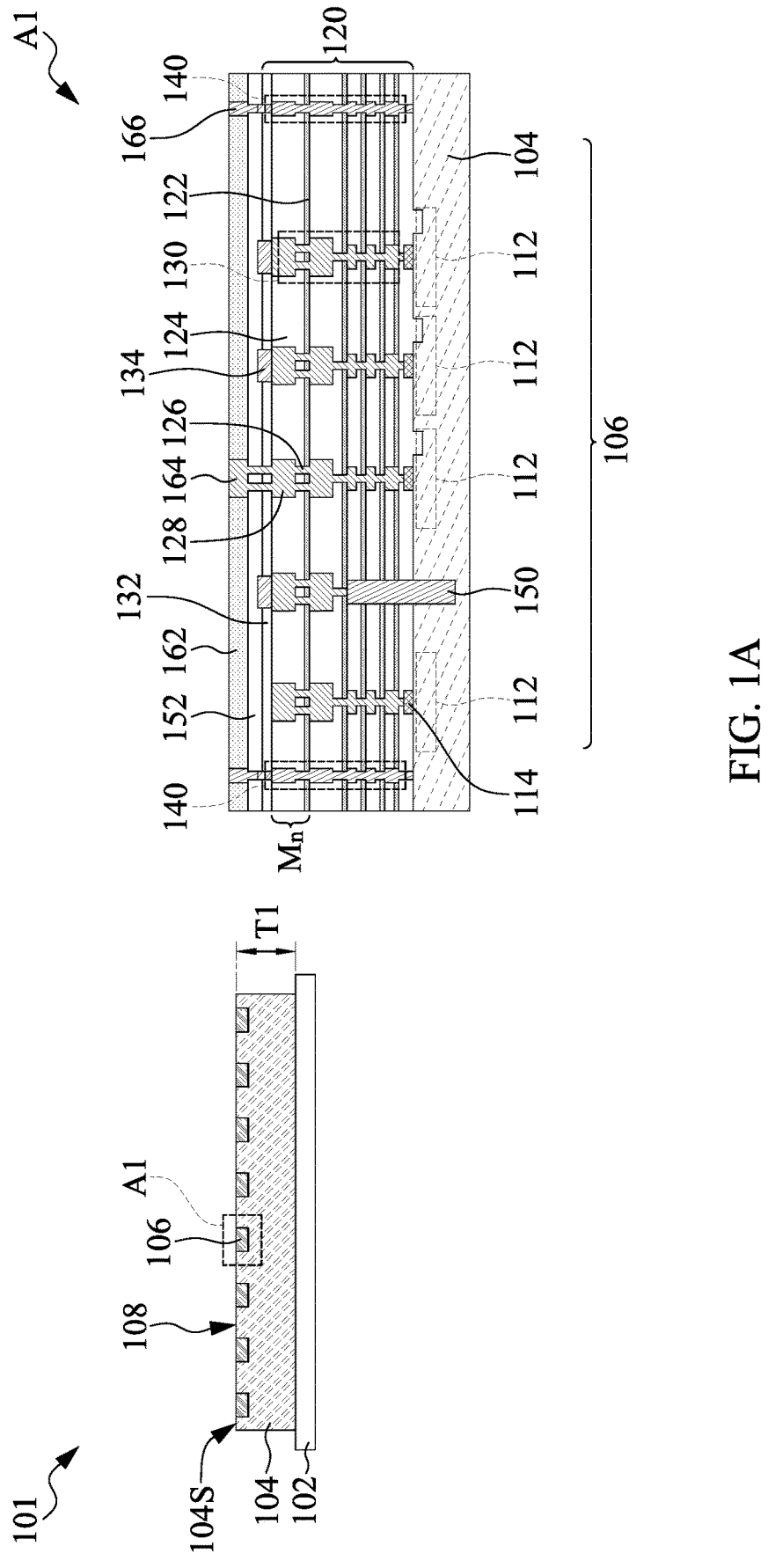

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the deviation normally found in the respective testing measurements. Also, as used herein, the terms "about," "substantial" or "substantially" generally mean within 10%, 5%, 1% or 0.5% of a given value or range. Alternatively, the terms "about," "substantial" or "substantially" mean within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "about," "substantial" or "substantially." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as being from one endpoint to another endpoint or between two endpoints. All ranges disclosed herein are inclusive of the endpoints, unless specified otherwise.

As used herein, the term "connected" may be construed as "electrically connected," and the term "coupled" may also be construed as "electrically coupled." "Connected" and "coupled" may also be used to indicate that two or more elements cooperate or interact with each other.

Throughout the present disclosure, a three-dimensional integrated circuit (3DIC), or 3D packaging device, refers to a semiconductor device formed of a stack of bonded semiconductor dies, in which the bonding between two of the semiconductor dies is performed through fusion bonding, hybrid bonding, or the like. A bonding layer, which may include bonding pads or bonding vias, is used for bonding two semiconductor dies, in which the bonding layers and bonding surfaces of the semiconductor dies have relatively flat surfaces so that the bonding can be performed in complete surface contact. The bonding structure may not include bonding bumps, e.g., solder bumps. The pitch and sizes of the bonding pads or bonding vias of the bonding layer is generally much less than those of non-3DIC bonding technologies, e.g., solder-bump technologies. As a result, the contact resistance and transmission speed of the bonded structure is enhanced.

During the manufacturing of the 3DIC, the individual semiconductor dies are prepared with a relatively small thickness so as to reduce the sizes, e.g., the heights, of the conductive vias. However, multiple thinning operations may be required to achieve a desired device thickness. Such thinning operations may generate chipped areas on the surface of the semiconductor dies. The reliability of the thinned semiconductor dies may be adversely impacted by the subsequent operations due to the chipped areas. As such, to address the abovementioned reliability issues, a new method of forming the 3DIC and the resulting 3DIC structure are proposed. The gap filling materials used after the thinning operation have an increased elasticity so that the stress induced by the gap-filling material can be effectively reduced. The reliability issues can be improved accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
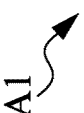
Figure 1D:
Figure 1E:
Figure 1H:
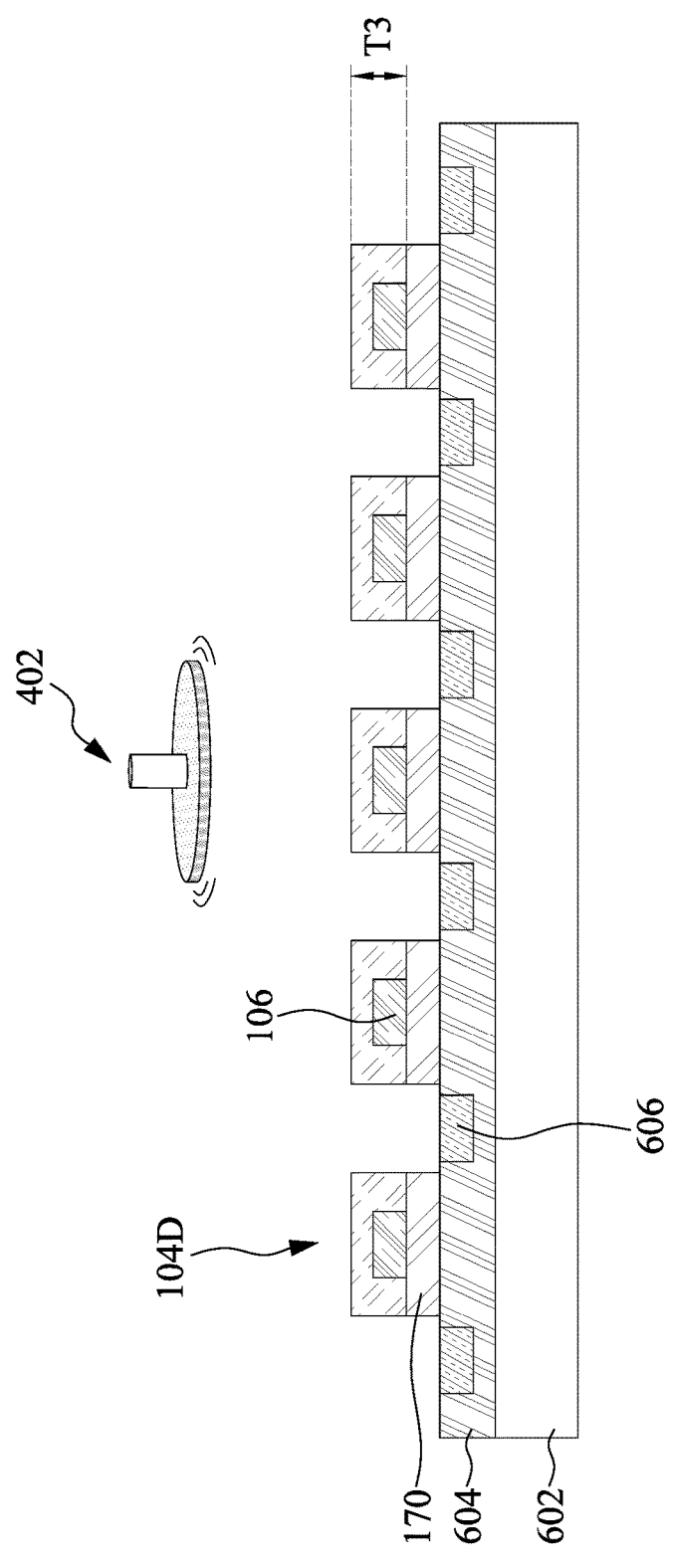
Figure 1I:
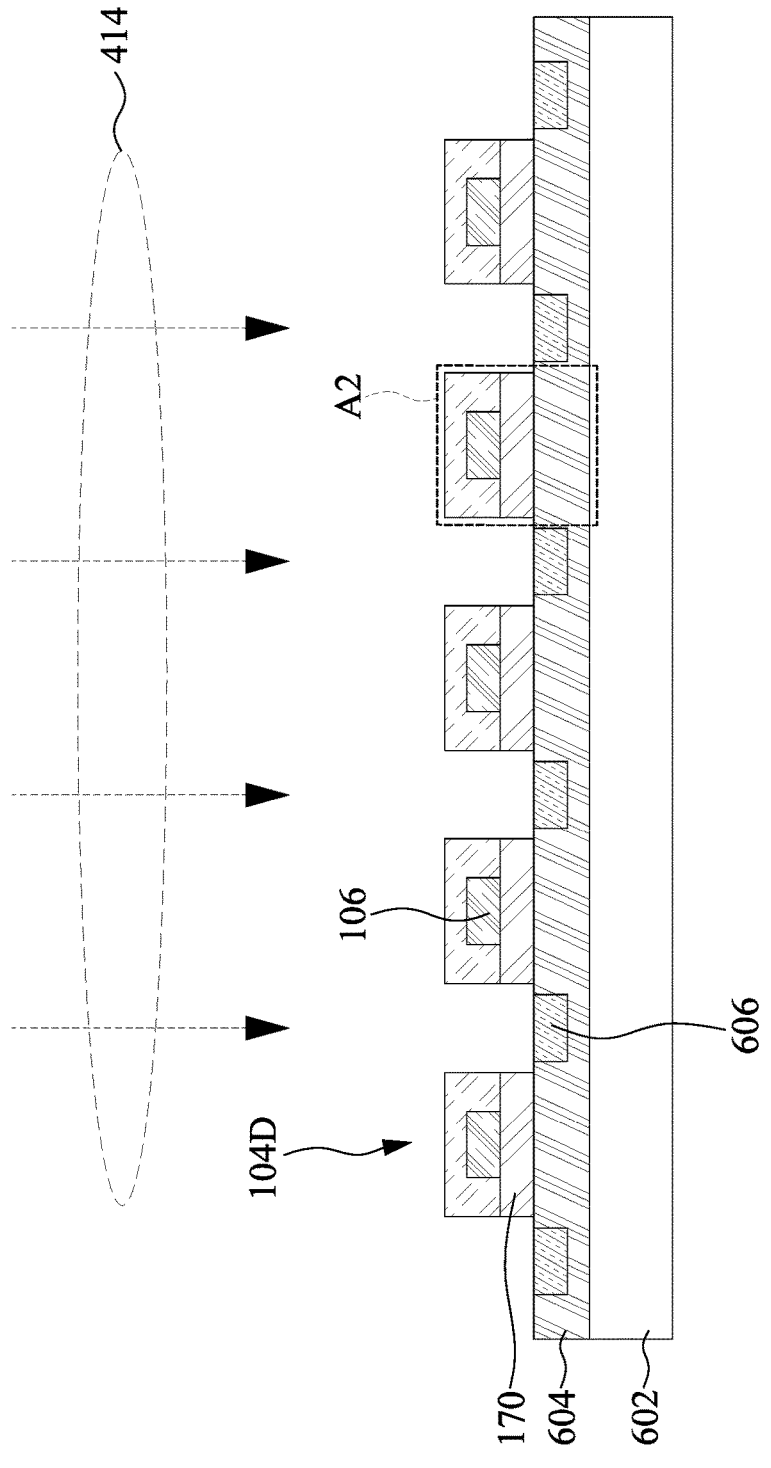
Figure 1J:
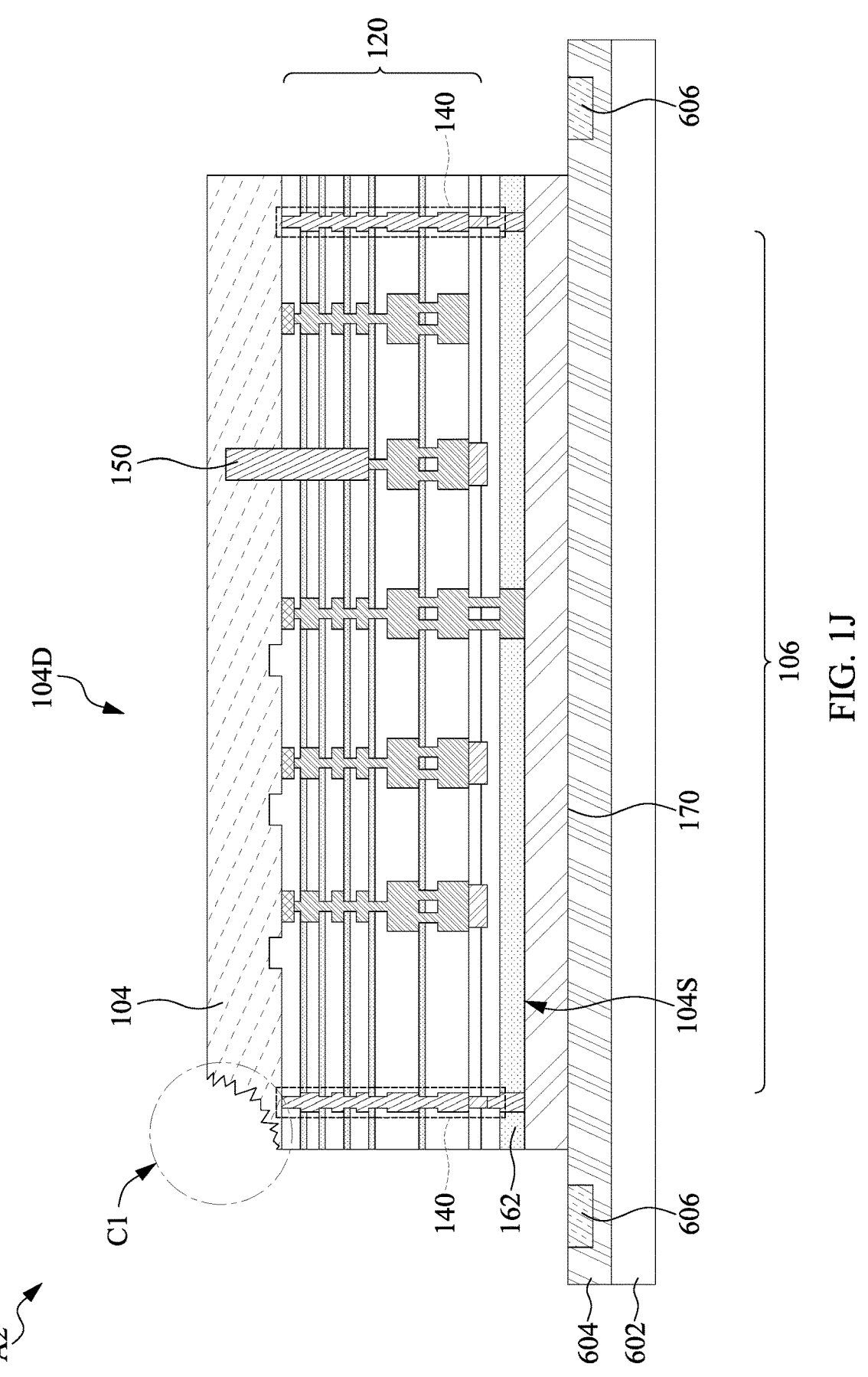
Figure 1P:
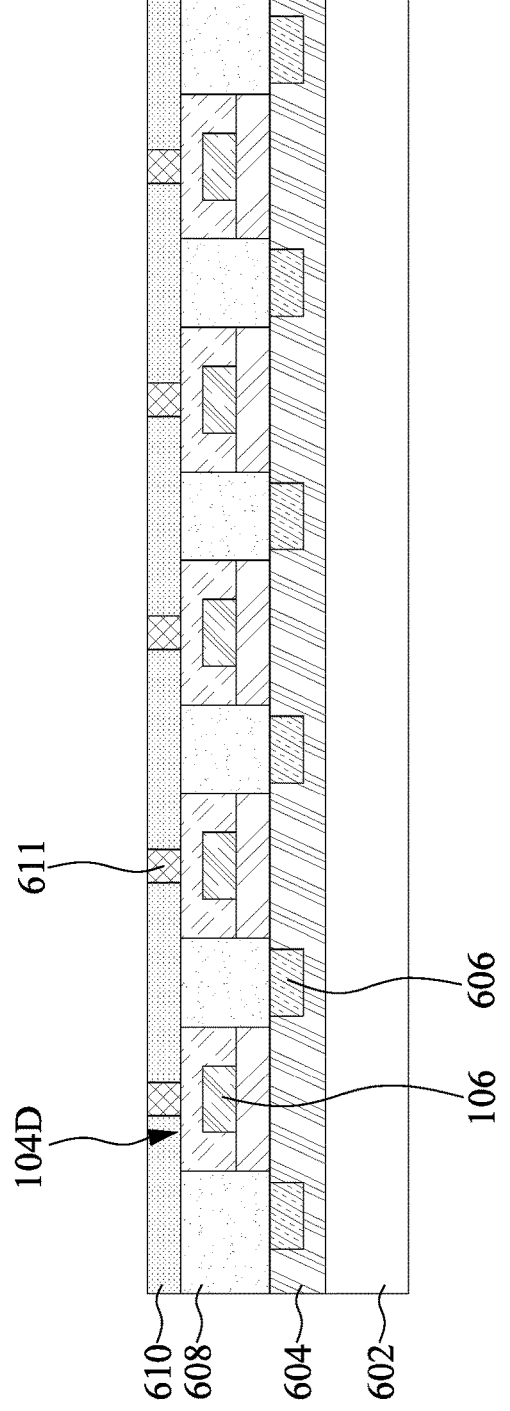
Figure 1T:
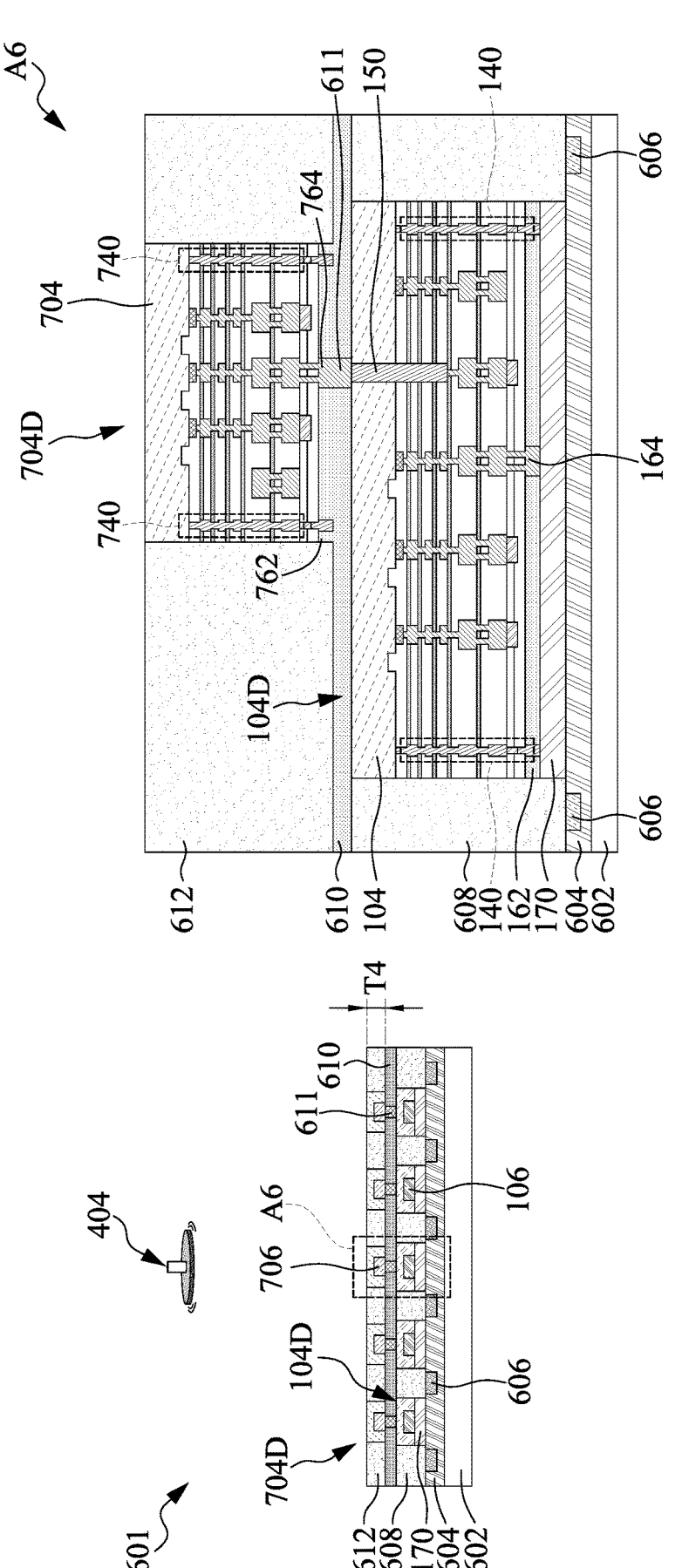
Figure 1V:
Figure 1W:
Figure 1X:
Figure 1Y:
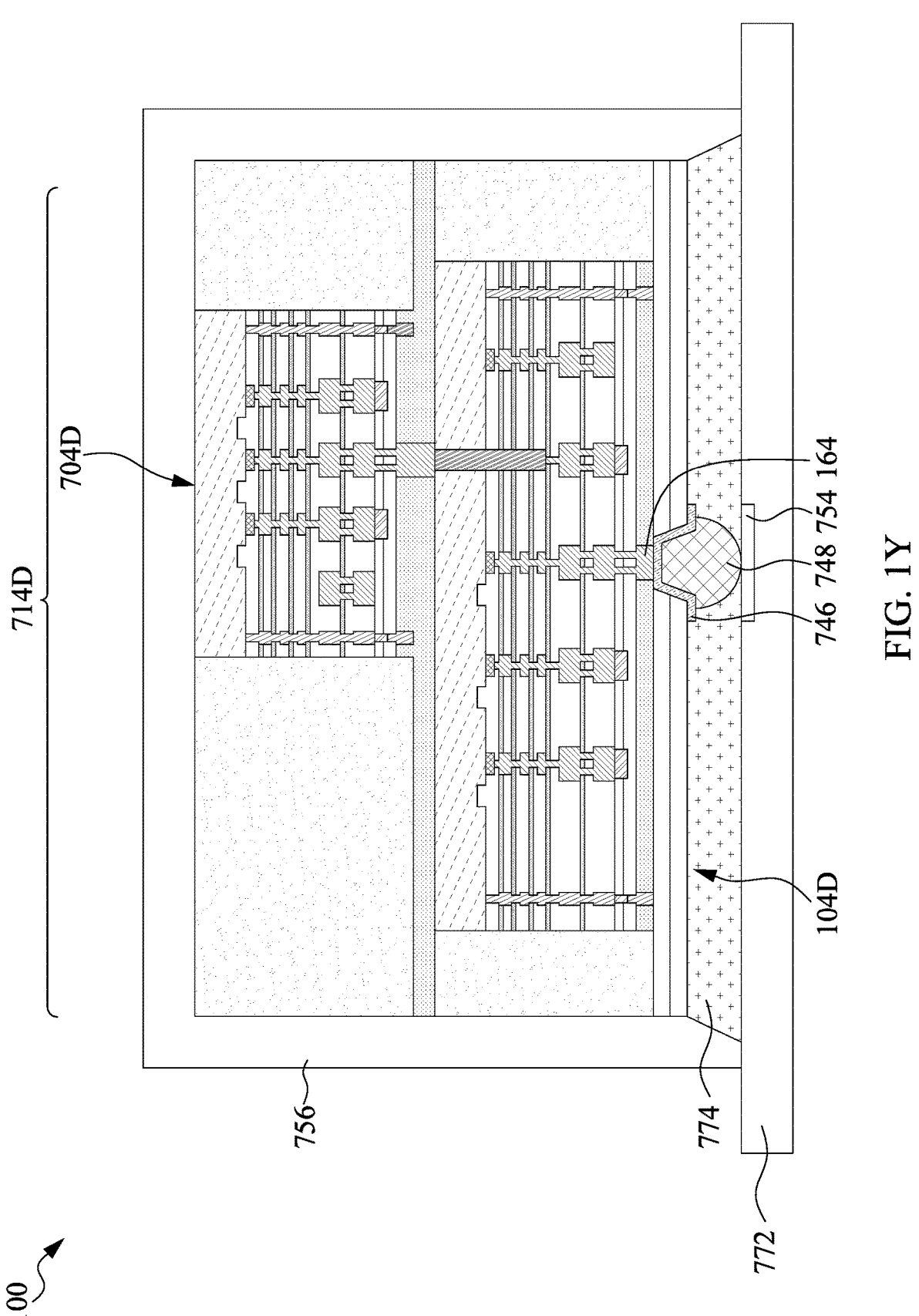

FIGS. 1A to 1Y are schematic cross-sectional views showing intermediate stages in a method of forming a semiconductor structure 100 (shown in FIG. 1Y), in accordance with various embodiments of the present disclosure. In some embodiments, the semiconductor structure 100 is a 3DIC die. FIG. 2 shows a schematic flowchart of a method 200 of manufacturing the semiconductor structure 100, in accordance with some embodiments. It shall be understood that additional steps can be provided before, during, and after the steps in method 200, and some of the steps described below can be replaced with other embodiments or eliminated. The order of the steps shown in FIGS. 1A to 1Y or in FIG. 2 may be interchangeable. Some of the steps may be performed concurrently or independently.

FIGS. 1A to 1L show the cross-sectional views of intermediate stages of operations for preparing a first tier of the 3DIC device. The relative steps are shown in steps S202 to S216 of method 200. Referring to FIG. 1A, in a left subfigure, a semiconductor structure 101 is formed, in which a carrier substrate 102 is received or provided. The carrier substrate 102 may be formed of semiconductor materials, e.g., bulk silicon, or may be a glass substrate, a ceramic substrate, or the like.

A semiconductor substrate 104 is received or provided over the carrier substrate 102. In some embodiments, the semiconductor substrate 104 includes a semiconductor material such as bulk silicon. In some embodiments, the semiconductor substrate 104 includes other semiconductor materials, such as silicon germanium, silicon carbide, gallium arsenide, or the like. In an embodiment, the semiconductor substrate 104 is a P-type semiconductor substrate (acceptor type). In some other embodiments, an N-type semiconductor substrate (donor type) 104 can be used. Alternatively, the semiconductor substrate 104 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; combinations thereof, or the like. In yet another embodiment, the semiconductor substrate 104 includes portions to form a semiconductor-on-insulator (SOI) substrate. In other alternatives, the semiconductor substrate 104 may include a doped epitaxial layer, a graded semiconductor layer, and/or a semiconductor layer overlaying another semiconductor layer of a different type, such as a silicon layer on a silicon germanium layer, or the like.

In some embodiments, multiple semiconductor devices 106 are formed along the upper surface 104S of the semiconductor substrate 104. The relative step is shown in step S202 of method 200. The semiconductor devices 106 may be arranged in rows, in columns, or in an array (e.g., in a top-down view) on the upper surface 104S. Scribe line areas 108 are arranged between adjacent semiconductor devices 106 to define the boundaries of the individual semiconductor devices 106. The scribe line areas 108 may include isolation regions or test structures (not separately shown). Referring to a right subfigure of FIG. 1A, a portion A1 of the semiconductor substrate 104 including an example semiconductor device 106 is enlarged to show more details of the semiconductor devices 106.

In some embodiments, the semiconductor device 106 includes doped regions, conductive features and dielectric features to form components 112 on the surface of the semiconductor substrate 104. In some embodiments, such components 112 are configured to form passive elements, such as a capacitor, an inductor, a diode, combinations thereof, or the like. In some embodiments, the components 112 are configured to form active devices such as bipolar junction transistors (BJTs), field effect transistors (FETs), or the like. In some embodiments, the components 112 include a planar FET, Fin-type FET, gate-all-around (GAA) FET, nanosheet FET, nanowire FET, or the like.

One or more contacts 114 are formed over the components 112 to serve as contacts to electrically connect to features of the components 112, e.g., a gate electrode, a source/drain region, a substrate body terminal, or the like.

An interconnect structure 120 is formed over the semiconductor substrate 104. The interconnect structure 120 is configured to electrically couple the components 112 to external devices, such as another semiconductor chip, through the contacts 114. In some cases, the interconnect structure 120 may redistribute the layout of connections between the components 112 to facilitate signal and power transmission, and thus is also referred to as a "redistribution layer (RDL)." The interconnect structure 120 may include layered metallization layers Mn, wherein the integer n denotes the layer index. Each of the metallization layers Mn may be formed of one or more dielectric materials over one another, e.g., an etch stop layer 122 and an inter-metal dielectric (IMD) layer 124. In some embodiments, the etch stop layer 122 and the IMD layer 124 may be formed of different materials, e.g., the IMD layer 124 is formed of oxides, such as un-doped silicate glass (USG), fluorinated silicate glass (FSG), low-k dielectric materials, or other dielectric materials, while the etch stop layer 122 is formed of silicon nitride, silicon carbide, silicon oxynitride, or the like.

In some embodiments, each of the metallization layers Mn includes metal line layers and metal via layers alternatively arranged with the metal line layers. The metal via layer may include patterned metal vias 126 and the metal line layer may include patterned metal lines 128. The metal vias 126 and metal lines 128 are collectively referred to the conductive members of the interconnect structure 120. The metal lines 128 in each metal line layer extend along a horizontal direction and are interconnected through adjacent vertical metal vias 126 in the intervening metal via layer. The metal lines 128 and metal vias 126 together construct one or more conductive interconnection routes 130 to transmit power or signals between the various components 112 in the semiconductor substrate 104 or between the semiconductor devices 106 and the overlying conductive features (not separately shown). The metal vias 126 and metal lines 128 are electrically insulated by the IMD layers 124. In some embodiments, metal vias 126 and metal lines 128 are further electrically insulated by the etch stop layers 122.

In some embodiments, the interconnect structure 120 further includes seal rings 140 formed of the metal vias 126 and the metal lines 128 from a bottom layer to a top layer of the metallization layers Mn. The seal ring 140 may be formed on the outside of the semiconductor device 106 in a ring shape from a top-view perspective to serve as a guard ring and protect the semiconductor devices 106 from foreign electrical interference or physical damage. In some embodiments, the seal rings 140 are electrically isolated from the interconnection routes 130. In some embodiments, the seal rings 140 can be used to serve as electrical ground of the semiconductor devices 106.

In some embodiments, the interconnect structure 120 further includes a conductive via 150 extending through multiple metallization layers Mn and into the semiconductor substrate 104. The conductive via 150 has an upper portion extending through the IMD layer 124 in the interconnect structure 120, and can be referred to as a through-oxide via (TOV), while the lower portion of the conductive via 150 extends into the semiconductor substrate 104, and can be referred to as a through-silicon via (TSV). In some embodiments, the conductive via 150 has an upper end electrically connected to a metal member of an interconnection route 130, and a lower end surrounded by the semiconductor substrate 104. The lower end of the conductive via 150 is covered during the stage of forming the semiconductor devices 106.

The metal vias 126 and metal lines 128 are formed of conductive materials, such as copper, tungsten, aluminum, titanium, tantalum, gold, silver, alloys thereof, combinations thereof, or the like. The etch stop layer 122 and IMD layer 124 may be formed by chemical vapor deposition (CVD), physical vapor deposition (PVD), atomic layer deposition (ALD), spin-on coating, or other suitable operations. The etch stop layers 122 or the IMD layers 124 may be patterned to include openings for the subsequently formed metal vias 126 and metal lines 128. The pattering operations may include photolithography and etching operations. The etching operations may include a dry etch, a wet etch, a combination thereof, or the like. The metal vias 126 and metal lines 128 may be deposited in the patterned openings of the etch stop layers 122 and/or the IMD layers 124 by CVD, PVD, ALD, plating, or other suitable operations. The configuration and number of metallization layers Mn of the interconnect structure 120 shown in FIG. 1A are for illustrative purposes only. The number of metallization layers Mn and the configurations of the metal vias 126 or metal lines 128 can be modified in adaptation to different applications as desired, and other numbers of metallization layers Mn and configurations of the interconnect structure 120 are still within the contemplated scope of the present disclosure.

A protective layer 132 is deposited and patterned over the interconnect structure 120. The protective layer 132 may be formed of a dielectric material, such as silicon nitride, silicon carbide, silicon oxynitride, or the like. The protective layer 132 may be patterned to include openings exposing the metal lines 128 in the top metallization layer Mn of the interconnect structure 120. Conductive pads 134 may be formed in the openings of the patterned protective layer 132 to electrically connect to the interconnect structure 120, e.g., a topmost metal line 128 in the interconnect route 130 or the seal ring 140.

In some embodiments, a first passivation layer 152 is deposited over the protective layer 132. In some embodiments, a second passivation layer 162 is deposited over the first passivation layer 152. The first passivation layer 152 and the second passivation layer 162 may be formed of different materials selected from, e.g., silicon oxide, silicon nitride, silicon carbide, silicon oxynitride, polymers, or other suitable dielectric materials. In some embodiments, the first passivation layer 152 and the second passivation layer 162 are patterned, and a conductive pad 164 is formed in the second passivation layer 162 and electrically connected to the underlying interconnection route 130 in the interconnect structure 120 through one or more metal vias 126 formed in the first passivation layer 152. In some embodiments, conductive pads 166 are also formed in the second passivation layer 162, and in some cases the first passivation layer 152, to electrically connect to the seal rings 140.

Throughout the present disclosure, the upper surface 104S is referred to as a frontside of the semiconductor substrate 104 where the components 112 are formed. Likewise, a backside of the semiconductor substrate 104 refers to a lower surface of the semiconductor substrate 104 opposite the frontside of the semiconductor substrate 104 or where the bulk semiconductor material of the semiconductor substrate 104 is exposed.

Referring to FIG. 1B, a bonding layer or a bonding film 170 is deposited over the semiconductor substrate 104. The relative step is shown in step S204 of method 200. The bonding layer 170 faces and covers the frontside of the semiconductor substrate 104. The bonding layer 170 may be formed of silicon oxide to facilitate bonding between the semiconductor devices 106 and other features through fusion bonding. In some embodiments, a planarization operation, e.g., grinding or chemical mechanical planarization (CMP), is used to planarize the surface of the bonding layer 170 after it is deposited.

Referring to FIG. 1C, another carrier substrate 302 is formed over the bonding layer 170. The carrier substrate 302 may include similar material to the carrier substrate 102. The semiconductor structure 101 is flipped, and the carrier substrate 102 is removed from the semiconductor substrate 104. The removal of the carrier substrate 102 may include etching, stripping, or other suitable removal operations. The backside of the semiconductor substrate 104 is exposed accordingly, as shown in FIG. 1C. In some embodiments, the semiconductor substrate 104 may include a thickness T1 between about 700 μm and about 900 μm, e.g., 780 μm, or the like.

FIG. 1D illustrates a first thinning operation on the semiconductor substrate 104. The relative step is shown in step S206 of method 200. A planarization tool 402 is introduced to perform the first thinning operation. The planarization tool 402 may be utilized to remove a thickness of the semiconductor substrate 104 from the backside of the semiconductor substrate 104. The first thinning operation may include mechanical grinding. In some embodiments, CMP is employed to perform the first thinning operation. In some embodiments, the thinned semiconductor substrate 104 has a thickness T2 between about 100 μm and about 150 μm, e.g., 120 μm, or the like. The first thinning operation performed in FIG. 1D removes most of the thickness T1 in the semiconductor substrate 104 to effectively reduce the thickness of the subsequently formed dies. In some embodiments, if the remaining thickness T2 is less than about 100 μm, or the like, the semiconductor substrate 104 may become fragile and susceptible to breaking during transport and moving of the semiconductor substrate 104.

Referring to FIG. 1E, a dicing operation or a singulation operation is performed to form individual semiconductor dies 104D from the semiconductor substrate 104. The relative step is shown in step S208 of method 200. In some embodiments, the semiconductor substrate 104 is arranged on a dicing tape 303, such as a back-grinding (BG) tape (e.g., in an example having been transferred from the carrier substrate 302). A cutting tool 412, e.g., a dicing blade or a dicing laser beam, is utilized to separate the semiconductor devices 106 into individual semiconductor dies 104D. The dicing operation is performed to remove portions of the scribe line areas 108 of the semiconductor substrate 104 and cut through the bonding layer 170.

In some embodiments, the semiconductor dies 104D include a logic die, which may be a central processing unit (CPU) die, a micro control unit (MCU) die, an input-output (IO) die, a baseband (BB) die, an application processor (AP) die, or the like. In some embodiments, the semiconductor die 104D is a memory die such as a dynamic random-access memory (DRAM) die, a static random-access memory (SRAM) die, a flash memory die, or may be another type of die.

Referring to FIG. 1F, yet another carrier substrate 602 is provided or received including a semiconductor structure 601. The carrier substrate 602 may include a material similar to the carrier substrate 102. A marking layer 604 is deposited over the carrier substrate 602. The marking layer 604 may also serve as a bonding layer, and is thus formed of silicon oxide. One or more alignment marks 606 are formed on the surface of the marking layer 604. In some embodiments, each of the alignment marks 606 is in a square shape, a rectangular shape, a cross shape, a triangular shape, or other suitable shape. The alignment marks 606 may include conductive materials, e.g., copper, or the like. In some embodiments, a pattering operation is performed on the marking layer 604 to form trenches, and a deposition operation is performed to fill the trenches with the conductive materials to thereby form the alignment marks 606.

The individual semiconductor dies 104D are bonded to the semiconductor structure 601, as shown in FIG. 1G. The relative step is shown in step S210 of method 200. In some embodiments, the semiconductor dies 104D are tested, and those semiconductor dies 104D passing the tests, also referred to as known good dies, are selected and bonded to the marking layer 604. The bonding operation may be performed through a "pick-and-place" procedure. The alignment marks 606 may aid in the alignment task of the bonding tool to align the semiconductor dies 104D with the marking layer 604 during the bonding operation. The semiconductor dies 104D are separated by a suitable distance for convenience of the pick-and-place procedure, and gaps are left between the semiconductor dies 104D.

In some embodiments, the semiconductor dies 104D are bonded to the carrier substrate 602 through the marking layer 604 and the bonding layer 170 in a manner of fusion bonding. Silicon atoms and oxygen atoms provided by the marking layer 604 and the bonding layer 170, respectively, or vice versa, form covalent silicon-oxygen bonds at the interface between the marking layer 604 and the bonding layer 170 to construct new molecules of silicon oxide. Therefore, the bonding interface between the semiconductor dies 104D and the carrier substrate 602 can be free of the bonding bumps, such as solder bump, solder ball, ball grid array (BGA), land grid array (LGA), pin grid array (PGA), controlled collapse of chip connection (C4) bump, or the like.

Referring to FIG. 1H, a second thinning operation is performed on the individual semiconductor dies 104D. The relative step is shown in step S212 of method 200. The planarization tool 402 may be introduced to perform the second thinning operation. The planarization tool 402 may be utilized to remove another thickness of the semiconductor substrate 104 from the backsides of the semiconductor dies 104D. The second thinning operation may include mechanical grinding. In some embodiments, CMP is employed to perform the second thinning operation. In some embodiments, the semiconductor substrate 104 has a thickness T3 between about 10 μm and about 40 μm, e.g., 20 μm, or the like. After the dicing and second thinning operation, the semiconductor dies 104D have a flat surfaces on the backside and sidewalls thereof.

A cleaning operation 414 is performed on the semiconductor structure 601, as illustrated in FIG. 1I. The cleaning operation 414 may be used to remove the fragments or debris of the semiconductor substrate 104 ground off the semiconductor dies 104D and left in the gaps between the semiconductor dies 104D during the second thinning operation. In some embodiments, a cleaning liquid is employed to flush or resolve the debris and fragments left by the second thinning operation.

Referring to FIG. 1J, an enlarged cross-sectional view of a portion A2 of the semiconductor structure 601 shown in FIG. 1I is illustrated. In some embodiments, the grinding force exerted on the semiconductor dies 104D, especially some parts, e.g., upper corners C1 of the semiconductor dies 104D may be damaged by the grinding force. A chipped portion may be generated around the corner C1, and thus the flat surfaces or the right angles of the corner C1 may be broken off or roughened. In some embodiments, such damaged corner C1 may become more stress-sensitive and is susceptible to cracking by stress induced by adjacent features. During the manufacturing of 3DIC devices, the size of a component die, e.g., the semiconductor die 104D, is reduced by, e.g., two to five times, or the like, as compared to their counterpart dies in the previous non-3DIC generation, and therefore a more stringent requirement is imposed on the die thickness to keep the thinness of the final die-stacking structure. Further, the dimensions of the conductive features and the insulating materials are also reduced proportionally. As a consequence, the tolerance of the semiconductor die 104D to the cracking damage may be reduced. The semiconductor die 104D may fail in subsequent operations due to cracking defects that extend from the chipped area or the damaged corner C1, and the concern on the device reliability becomes more serious.

Referring to FIG. 1K, a dielectric material 608 serves as a gap-filling material to fill the gaps between the semiconductor dies 104D. The relative step is shown in step S214 of method 200. In some embodiments, a portion of the dielectric material 608 extends over the semiconductor dies 104D. In some embodiments, the dielectric material 608 includes an organic material. In some embodiments, the dielectric material 608 includes a polymeric or polymer-based material, e.g., epoxy molding compound, polyimide, or the like. In some embodiments, the dielectric material 608 includes polyphenylene sulfide (PPS), polyether ether ketone (PEEK), polysulfone (PES), a molding underfill, an epoxy, a resin, polybenzoxazole (PBO), benzocyclobutene (BCB), polysiloxane, a combination thereof or the like. In some embodiments, the dielectric material 608 embeds inorganic fillers, e.g., silicon oxide, or the like. In some embodiments, the dielectric material 608 has a coefficient of thermal expansion (CTE) greater than that of the silicon oxide or nitride, which is used in the IMD layer 124 or the etch stop layer 122.

In some embodiments, the CTE of the dielectric material 608 is less than ten times the CTE of the IMD layer 124 or the etch stop layer 122, less than five times the CTE of the IMD layer 124 or the etch stop layer 122, less than twice the CTE of the IMD layer 124 or the etch stop layer 122, or the like. In some embodiments, a ratio of CTE between the dielectric material 608 and the IMD layer 124 (or the etch stop layer 122) is between about one and about ten, between about one and five, between about one and two, or the like.

In some embodiments, the dielectric material 608 is used as a molding material. The dielectric material 608 may be in a liquid form and thus can be dispensed to fill the gaps between the semiconductor dies 104D and surround the semiconductor dies 104D laterally. In some embodiments, a curing step is performed to harden the dielectric material 608. During the curing operation, the dielectric material 608 may expand or deform and exerts stress on the semiconductor dies 104D. In some embodiments, the dielectric material 608 has a relatively better fluidity and elasticity as compared to the IMD layer 124 or the etch stop layer 122, e.g., silicon oxide or silicon nitride, used in the interconnect structure 120. In some embodiments, the dielectric material 608 has a lower hardness and greater ductility than the material of the IMD layer 124 or the etch stop layer 122 so as to generate less stress on the semiconductor dies 104D than the stress exerted by the IMD layer 124 (formed of silicon oxide) or the etch stop layer 122 (formed of silicon nitride).

Existing methods of filling the gaps between the semiconductor dies 104D adopt materials of silicon oxide or silicon nitride, which supports desirable hardness to protect the semiconductor dies 104D. However, the silicon oxide or nitride is also more brittle than the polymer-based dielectric material 608. In the presence of the chipped portion C1 in the corners of the semiconductor dies 104D, the filling material of silicon oxide or nitride may generate a noticeable amount of stress on the damaged surface of the chipped portion C1 and promotes the cracking or breaking to occur from the damaged surface toward the inside of the semiconductor dies 104D. In contrast, the dielectric material 608 adopts the polymeric-based material, which is more elastic and imposes less stress on the chipped portion C1 of the semiconductor dies 104D under an acceptable degree of thermal expansion. Therefore, the likelihood of cracking or breaking off of the semiconductor dies 104D can thus be reduced despite the presence of the defective chipped portion C1 in the semiconductor dies 104D.

Referring to a left subfigure of FIG. 1L, a third thinning operation is performed on the semiconductor structure 601. The relative step is shown in step S216 of method 200. The semiconductor dies 104D are further thinned down from backsides thereof through the third thinning operation. In addition, excess material of the dielectric material 608 is also removed. Due to the third thinning operation, the upper surface of the dielectric material 608 is level with the upper surfaces of the semiconductor dies 104D. As a result of the three thinning operations (e.g., the first, second, and third thinning operations), the semiconductor dies 104D are thinned to a desired thickness T4 for packaging in a 3DIC device. In some embodiments, the thickness T4 is between about 15 μm and about 30 μm, e.g., 20 μm, or the like. In some embodiments, the third thinning operation is performed through CMP by a CMP tool 403, which provides a planarized upper surface of the semiconductor structure 601 with a tolerance of the level uniformity within ten nanometers. In some embodiments, the third thinning operation provides a level uniformity greater than the first and second thinning operations shown in FIGS. 1D and 1H for facilitating subsequent operations of fusion bonding or hybrid bonding.

Referring to FIG. 1L, a portion A3 of the semiconductor structure 601 shown in the left subfigure is enlarged in the right subfigure. A portion the chipped area C1 has a roughened surface on the corner of the semiconductor substrate 104 of the semiconductor die 104D. In some embodiments, the chipped area C1 has a sidewall or a top surface with a non-flat or irregular shape. Due to the desirable fluidity of the dielectric material 608, the pits and gaps on the surface of the chipped area C1 are filled. The stress imposed by the dielectric material 608 is within device specifications, and thus the reliability of the semiconductor die 104D can be maintained.

FIGS. 1M to 1O show the cross-sectional views of intermediate stages of operations for preparing semiconductor dies 704D. The relative steps are shown in steps S218 through S222 of method 200. The semiconductor dies 704D are to be arranged in a second tier of the 3DIC device. The preparation steps for the semiconductor dies 704D shown in FIGS. 1M to 1O may correspond to FIGS. 1A to 1E showing the preparation steps for the semiconductor dies 104D. In some embodiments, the features described in the procedures with reference to FIGS. 1M to 1O having feature names identical to those described with references to FIGS. 1A to 1E share similar materials, dimensions, configurations, and functions unless stated otherwise expressly.

Referring to FIG. 1M, in a left subfigure, a semiconductor structure 701 is formed, in which a carrier substrate 702 is received or provided. The carrier substrate 702 is similar to the carrier substrate 102, and may be formed of semiconductor materials, e.g., bulk silicon, or may be a glass substrate, a ceramic substrate, or the like. A semiconductor substrate 704 is received or provided over the carrier substrate 702. In some embodiments, the semiconductor substrate 704 has a thickness T1.

In some embodiments, multiple semiconductor devices 706 are formed along the upper surface 704S of the semiconductor substrate 704. The relative step is shown in step S218 of method 200. The semiconductor devices 706 may be arranged in rows, in columns, or in an array on the upper surface 704S. Scribe line areas 708 are arranged between adjacent semiconductor devices 706 to define the boundaries of the individual semiconductor devices 706. Referring to a right subfigure of FIG. 1M, a portion A4 of the semiconductor substrate 704 including an example semiconductor device 706 is enlarged to shown more details of the semiconductor device 706.

In some embodiments, the semiconductor device 706 may include doped regions, conductive features and dielectric features to form components 712 on the surface of the semiconductor substrate 704. In some embodiments, such components 712 are configured to form passive elements, such as a capacitor, an inductor, a diode, combinations thereof, or the like. In some embodiments, the components 712 are configured to form active devices such as bipolar junction transistors (BJTs), field effect transistors (FETs), or the like. In some embodiments, the components 712 include Fin-type FET, gate-all-around (GAA) FET, nanosheet FET, nanowire FET, or the like.

One or more conductive vias 714 are formed over the components 712 to serve as contacts to electrically connect to features of the components 712, e.g., a gate electrode, a source/drain region, a substrate body terminal, or the like.

An interconnect structure 720 is formed over the semiconductor substrate 704. The interconnect structure 720 may include layered metallization layers Mn, wherein the integer n denotes the layer index. Each of the metallization layers Mn may be formed of one or more dielectric materials over one another, e.g., an etch stop layer 722 and an inter-metal dielectric (IMD) layer 724. In some embodiments, the etch stop layer 722 and the IMD layer 724 may be formed of different materials, e.g., the IMD layer 724 is formed of oxides, such as USG, FSG, low-k dielectric materials, or other dielectric materials, while the etch stop layer 722 is formed of silicon nitride, silicon carbide, silicon oxynitride, or the like.

In some embodiments, each of the metallization layers Mn includes metal line layers and metal via layers alternatively arranged with the metal line layers. The metal via layer may include patterned metal vias 726 and the metal line layer may include patterned metal lines 728. In some embodiments, the interconnect structure 720 further include seal rings 740 formed of the metal vias 726 and the metal lines 728 from a bottom layer to a top layer of the metallization layers Mn. The metal vias 726 and metal lines 728 are collectively referred to the conductive members of the interconnect structure 720.

A protective layer 732 is deposited and patterned over the interconnect structure 720. The protective layer 732 may be formed of a dielectric material, such as silicon nitride, silicon carbide, silicon oxynitride, or the like. Conductive pads 734 may be formed in the openings of the patterned protective layer 732 to electrically connect to the interconnect structure 720, e.g., a topmost metal line 728 in an interconnect route 730 or the seal ring 740.

In some embodiments, a first passivation layer 752 is deposited over the protective layer 732. In some embodiments, a second passivation layer 762 is deposited over the first passivation layer 752. The first passivation layer 752 and the second passivation layer 762 may be formed of different materials selected from, e.g., silicon oxide, silicon nitride, silicon carbide, silicon oxynitride, or other suitable dielectric materials. In some embodiments, the first passivation layer 752 and the second passivation layer 762 are patterned, and a conductive pad 764 is formed in the second passivation layer 762 and electrically connected to the underlying interconnection route 730 in the interconnect structure 720 through one or more metal vias 726. In some embodiments, conductive pads 766 are also formed in the second passivation layer 762, and in some cases the first passivation layer 752, to electrically connect to the seal rings 740. In some embodiments, the second passivation layer 762 serves as a bonding layer and is formed of silicon oxide to facilitate fusion bonding or hybrid bonding.

Referring to FIG. 1N, another carrier substrate 703 is formed over the semiconductor substrate 704. The carrier substrate 703 may include similar material to the carrier substrate 102. The semiconductor structure 701 is flipped, and the carrier substrate 702 is removed from the semiconductor substrate 704.

A fourth thinning operation is performed on the semiconductor substrate 704. The relative step is shown in step S220 of method 200. A planarization tool 404 is introduced to perform the fourth thinning operation. In some embodiments, CMP is employed to perform the fourth thinning operation. In some embodiments, the thinned semiconductor substrate 104 has a thickness T2 between about 100 μm and about 150 μm, e.g., 120 μm, or the like.

Referring to FIG. 1O, a dicing operation or a singulation operation is performed on the semiconductor substrate 704. The relative step is shown in step S222 of method 200. The semiconductor substrate 704 is arranged on a dicing tape 713, such as a BG tape (e.g., in an example having been transferred from the carrier substrate 703). A cutting tool 412, e.g., a dicing blade or a dicing laser beam, is utilized to separate the semiconductor devices 706 into individual semiconductor dies 704D.

In some embodiments, the semiconductor dies 704D include a logic die, which may be a CPU die, an MCU die, an IO die, a BB die, an AP die, or the like. In some embodiments, the semiconductor die 704D include a memory die such as a DRAM die, a SRAM die, a flash memory die, or may be another type of die.

FIGS. 1P to 1Y show the cross-sectional views of intermediate stages of operations for bonding the semiconductor dies 704D to the semiconductor dies 104D. The relative steps are shown in steps S224 through S240 of method 200. In some embodiments, the features described in the procedures with reference to FIGS. 1P to 1Y with the feature names identical to those described in the procedures with references to FIGS. 1A to 1O share similar materials, dimensions, configurations, and functions unless stated otherwise expressly.

Referring to FIG. 1P, a bonding layer or bonding film 610 is deposited over the semiconductor structure 601, including over the semiconductor dies 104D and the dielectric material 608. The relative step is shown in step S224 of method 200. In some embodiments, the bonding layer 610 includes a material similar to the bonding layer 170 or the marking layer 604. In some embodiments, although not separately shown, the bonding layer is formed as a marking layer, in which one or more alignment marks are formed on the surface of the marking layer 610 for facilitating bonding alignment during the bonding of the semiconductor dies 704D to the semiconductor dies 104D.

The bonding layer 610 may be patterned to form openings through a patterning operation. Conductive materials are deposited in the openings to form multiple conductive bonding pads 611. In some embodiments, the conductive bonding pads 611 include a conductive material, such as copper, tungsten, aluminum, titanium, tantalum, alloys thereof, a combination thereof, or the like. In some embodiments, a planarization operation is performed to remove excess portions of the conductive material over the surface of the bonding layer 610 and level the surface of the bonding pads 611 with the upper surface of the bonding layer 610. The surface of the bonding layer 610 and the bonding pads 611 are planarized to ensure a relative flat surface is generated for reliable bonding with the semiconductor dies 704D.

Referring to FIG. 1Q, the individual semiconductor dies 704D are bonded to the semiconductor dies 104D through the bonding layer 610. The relative step is shown in step S226 of method 200. In some embodiments, the semiconductor dies 704D passing the test (e.g., known good dies) are selected and bonded to the bonding layer 610. The bonding operation may be performed through a pick-and-place procedure.

In some embodiments, the semiconductor dies 704D are bonded to the semiconductor dies 104D through the second passivation layer 762 and the bonding layer 610 in accordance with a hybrid bonding process. In some embodiments, the bonding layer 610 includes a lower surface and an upper surface opposite the lower surface, wherein the lower surface of the bonding layer 610 contacts an entirety of each of the upper surface of the semiconductor dies 104D (e.g., the thinned surface of the semiconductor substrate 104), while the upper surface of the bonding layer 610 contacts an entirety of each of the lower surface of the semiconductor dies 704D (e.g., the surface of the second passivation layer 762). During the hybrid bonding operation, silicon atoms and oxygen atoms provided by the second passivation layer 762 and the bonding layer 610, respectively, or vice versa, form covalent silicon-oxygen bonds at the non-conductive portions of the interface between the second passivation layer 762 and the bonding layer 610, to construct new molecules of silicon oxide. At the same time, metallic atoms provided by the bonding pads 611 and the conductive via 150 form metallic bonds at the conductive portions of the interface between the bonding pads 611 and the conductive via 150.

The semiconductor dies 104D can thus be reliably bonded and electrically connected to the corresponding semiconductor dies 704D to form a composite die structure. Therefore, the bonding interface between the second passivation layer 762 and the bonding layer 610 can be free of bonding bumps, such as solder bumps, solder balls, BGA, LGA, PGA, C4 bumps, microbumps, or the like. The bonded structure formed by the semiconductor dies 104D and 704D can maintain a relatively small thickness without the additional thickness which would otherwise be contributed by the bonding bumps mentioned above. The interconnection path that would otherwise be formed by the bonding bumps is replaced by an interconnection path formed by the bonding pad 611 and the conductive via 150 through the bonding interface.

Although the present embodiment illustrates only one interconnection path formed by the conductive via 150 and the bonding pad 611, the present disclosure is not limited thereto. Any array of conductive vias 150 and bonding pads 611 can be provided with via density or pad density much higher than the density of the existing bonding bumps. Additionally, the heights of the conductive vias 150 and bonding pads 611 can also be less than the height of bonding bumps. As a result, the bonding efficiency, the bonded die size, and the electrical resistance caused by the bonding structure of the proposed hybrid bonding can be significantly improved over the existing bump-based bonding.

Referring to FIG. 1R, a fifth thinning operation is performed on the semiconductor dies 704D. The relative step is shown in step S228 of method 200. The planarization tool 404 may be introduced to perform the fifth thinning operation. The planarization tool 404 may be utilized to remove yet another thickness of the semiconductor substrate 704 from the backside of the semiconductor substrate 704. The fifth thinning operation may include mechanical grinding. In some embodiments, CMP is employed to perform the fifth thinning operation. In some embodiments, the semiconductor substrate 704 has a thickness T3 between about 20 μm and about 50 μm, e.g., 25 μm, or the like. In some embodiments, a cleaning operation is performed on the semiconductor structure 601 to remove the debris of the semiconductor dies 704D during ad/or after the fifth thinning operation.

In some embodiments, although not separately shown, the fifth thinning operation may damage the semiconductor substrate 704 of the semiconductor dies 704D to generate one or more chipped portions, in a situation similar to that happening in the semiconductor dies 104D, as described with reference to FIGS. 1H and 1J.

Referring to FIG. 1S, a dielectric material 612 serves as a gap-filling material to fill the gaps between the semiconductor dies 704D. The relative step is shown in step S230 of method 200. In some embodiments, a portion of the dielectric material 612 extends over the semiconductor dies 704D and surrounds the semiconductor dies 704D laterally. In some embodiments, a curing step is performed to harden the dielectric material 612. During the curing operation, the dielectric material 612 may expand or deform and exerts stress on the semiconductor dies 704D. In some embodiments, the dielectric material 612 includes a material similar to the dielectric material 608. In some embodiments, the dielectric material 612 includes an organic material. In some embodiments, the dielectric material 612 includes a polymeric material, e.g., epoxy molding compound, polyimide, or the like. In some embodiments, the dielectric material 612 includes polyphenylene sulfide (PPS), polyether ether ketone (PEEK), polysulfone (PES), a molding underfill, an epoxy, a resin, polybenzoxazole (PBO), benzocyclobutene (BCB), polysiloxane a combination thereof, or the like. In some embodiments, the dielectric material 612 embeds inorganic fillers, e.g., silicon oxide, or the like.

In some embodiments, the CTE of the dielectric material 612 is less than ten times the CTE of the IMD layer 124 or the etch stop layer 122, less than five times the CTE of the IMD layer 124 or the etch stop layer 122, less than twice the CTE of the IMD layer 124 or the etch stop layer 122, or the like. In some embodiments, a ratio of CTE between the dielectric material 612 and the IMD layer 124 (or the etch stop layer 122) is between about one and about ten, between about one and five, between about one and two, or the like.

Referring to a left subfigure of FIG. 1T, a sixth thinning operation is performed on the semiconductor structure 601. The relative step is shown in step S232 of method 200. The semiconductor dies 704D are further thinned down from backsides thereof through the sixth thinning operation. In addition, excess material of the dielectric material 612 is also removed. After the sixth thinning operation, an upper surface of the dielectric material 612 is level with the upper surfaces of the semiconductor dies 704D. Through the three thinning operations (e.g., the fourth, fifth, and sixth thinning operations), the semiconductor dies 704D are thinned to the thickness T4. In some embodiments, the sixth thinning operation is performed by a mechanical grinding tool 404 or by a CMP tool 404.

Referring to FIG. 1T, a portion A6 of the semiconductor structure 601 shown in the left subfigure is enlarged in the right subfigure. Although not separately shown, the semiconductor die 704D may include a chipped area with a roughened surface on the upper corners of the semiconductor die 704D. Due to the desirable fluidity of the dielectric material 612, the pits and gaps on the surface of the chipped area C1 are filled. The stress imposed by the dielectric material 612 is within device specifications, and thus the reliability of the semiconductor dies 704D can be maintained.

Referring to a left subfigure of FIG. 1U, another carrier substrate 622 is formed over the semiconductor dies 704D and the dielectric material 612. The carrier substrate 622 may include similar material to the carrier substrate 602. In some embodiments, a marking layer 624 is deposited over the carrier substrate 622. The marking layer 624 may include alignment marks 736. The configurations, materials and method of forming for the marking layer 624 may be similar to those of the marking layer 604.

The semiconductor structure 601 is flipped. A portion A6 of the semiconductor structure 601 shown in the left subfigure is enlarged in the right subfigure. The carrier substrate 602, the marking layer 624 and the bonding layer 170 are removed from the semiconductor dies 104D. The removal of the carrier substrate 602, the marking layer 624 and the bonding layer 170 may include etching, stripping, or other suitable removal operations. The frontside or the interconnect structure 120 of the semiconductor die 104D is exposed accordingly. The relative step is shown in step S234 of method 200.

FIGS. 1V and 1W illustrate the formation of bonding bump 748. The relative step is shown in step S236 of method 200. Referring to FIG. 1V, a first protective layer 742 is deposited over the semiconductor die 104D according to some embodiments of the present disclosure. The first protective layer 742 may include a dielectric material, e.g., silicon oxide, silicon nitride, silicon carbide or other suitable dielectric materials. In some embodiments, the first protective layer 742 includes a material similar to the first passivation layer 152 or the second passivation layer 162. In some embodiments, a second protective layer 744 is deposited over the first protective layer 742. The second protective layer 744 may include a dielectric material, e.g., silicon oxide, silicon nitride, silicon carbide, polyimide, PCB, PEEK, PES, PPS, polysiloxane or other suitable dielectric materials. The second protective layer 744 is formed of a material different from that of the first protective layer 742. In some embodiments, the second protective layer 744 includes a material similar to the first passivation layer 152 or the second passivation layer 162.

A patterning operation is performed to etch an opening 742T through the second protective layer 744 and the first protective layer 742. A portion of the conductive pad 164 is exposed through the second protective layer 744 and the first protective layer 742 accordingly. In some embodiments, the patterning operation includes photolithography and etching operations. The etching operation may include a dry etch, a wet etch, a combination thereof, or the like.

Referring to FIG. 1W, an under-bump metallization (UBM) layer 746 is formed in the opening 742T and over the bond pad 164. In some embodiments, the UBM layer 746 includes a diffusion barrier layer, a seed layer, or a seed layer over a diffusion barrier layer. In some embodiments, the diffusion barrier layer includes titanium, titanium nitride, tantalum, tantalum nitride, or the like. In some embodiments, the seed layer includes copper or copper alloys. The UBM layer 746 may be formed by CVD, PVD, sputtering or other suitable methods.

Next, a connector 748 is mounted to the backside of the semiconductor dies 104D through the UBM layer 746. In some embodiments, the connector 748 includes a solder material, e.g., lead-based materials, such as Sn, Pb, Ni, Au, Ag, Cu, Bi, combinations thereof, mixtures of other electrically conductive materials, or the like. In some other embodiments, the solder material includes a lead-free element. A thermal process may be performed on the solder material, forming the connector 748. In some embodiments, the connector 748 includes a spherical shape, an oval shape, or other shapes. In some embodiments, the connector 748 is referred to as a solder ball, and is formed of a conductive bump or contact bump, such as a C4 bump, a BGA bump, a LGA bump, a PGA bump, a microbump, or the like.

Referring to FIG. 1X, a dicing operation or a singulation operation is performed on the bonded semiconductor structure 601. The relative step is shown in step S238 of method 200. The cutting tool 412, e.g., a dicing blade or a dicing laser beam, is utilized to separate the bonded die stack formed of the semiconductor dies 104D and 704D into individual semiconductor dies 714D.

Referring to FIG. 1Y, each of the semiconductor dies 714D is bonded to a substrate 772. The substrate 772 may be a printed circuit board (PCB), a substrate of another semiconductor die, an interposer die, or a substrate of other suitable devices. The substrate 772 may include an interconnection structure including a conductive pad 754. The material and forming method of the conductive pad 754 may be similar to those of the conductive pad 164. The semiconductor die 714D is bonded and electrically connected to the substrate 772 through the bonding of the connector 748 to the conductive pad 754.

In some embodiments, a molding underfill material 774 is used to encapsulate the connector 748. The molding underfill may include a polymer-based material, such as a liquid molding compound, epoxy, or other insulating material. A molding material 756 is employed to mold the semiconductor die 714D, the substrate 772 and the connector 748. Further, the molding material 756 molds the components of the semiconductor die 714D, e.g., the semiconductor dies 104D, 704D, the dielectric materials 608 and 612, and the molding underfill material 774. The relative step is shown in step S240 of method 200. The molding material 756 may include a polymer-based material, such as the epoxy molding compound, polyimide, PCB, PEEK, PES, PPS, polysiloxane, or the like.

In the present embodiment, the semiconductor dies 704D is bonded to the semiconductor dies 104D through the bonding of the frontside of the semiconductor dies 704D to the backsides of the semiconductor dies 104D, which may be referred to as a face-to-back bonding type. In some other embodiments, the proposed bonding method and structure described above can be applied to a face-to-face bonding type, in which the frontsides of the semiconductor dies 704D are bonded to the frontsides of the semiconductor dies 104D. For example, the semiconductor dies 704D can be electrically bonded to the frontsides of the semiconductor dies 104D through the conductive pad 764, the bonding pad 611 and the conductive pad 164 of the interconnect structure 120.

FIG. 3 is a schematic cross-sectional view of a semiconductor structure 300, in accordance with some embodiments.

The semiconductor structure 300 is similar to the semiconductor die 714D with some features omitted for clarity. Since the semiconductor die 104D has a width different from that of the semiconductor die 704D, the locations of the seal rings 140 of the semiconductor die 104D may be aligned or misaligned with the seal rings 740 of the semiconductor die 704D. In most cases, when the widths of the semiconductor dies 104D and 704D are different, at most one of the seal rings 140 can be aligned with one of the seal rings 740. In some embodiments, a seal ring gap DS is defined as a distance determined by the horizontal location X1 of the left-side seal ring 140 subtracted by the horizontal location X2 the left-side seal ring 740, i.e., DS=X2-X1.

Referring to FIG. 3, the seal ring gap DS of the semiconductor structure 300 is a positive number. In some embodiments, the seal ring gap DS is in a range between 0 μm and about 3 μm, such as 1 μm, or the like. In some other embodiments, the seal ring gap DS is substantially zero or a negative number dependent upon design requirements. In some embodiments, the configuration of the semiconductor structure 300 shown in FIG. 3 can make most use of the scribe line area 108 and save the most space for dicing so that the device integrity of the semiconductor dies 104D and 704D can be ensured after dicing. The formula for the seal ring gap DS can also be applied to the right-side seal rings 140 and 740, but the interpretation of the polarity of the seal ring gap DS may be reversed to that of the left-side seal rings 140 and 740.

Figure 4:
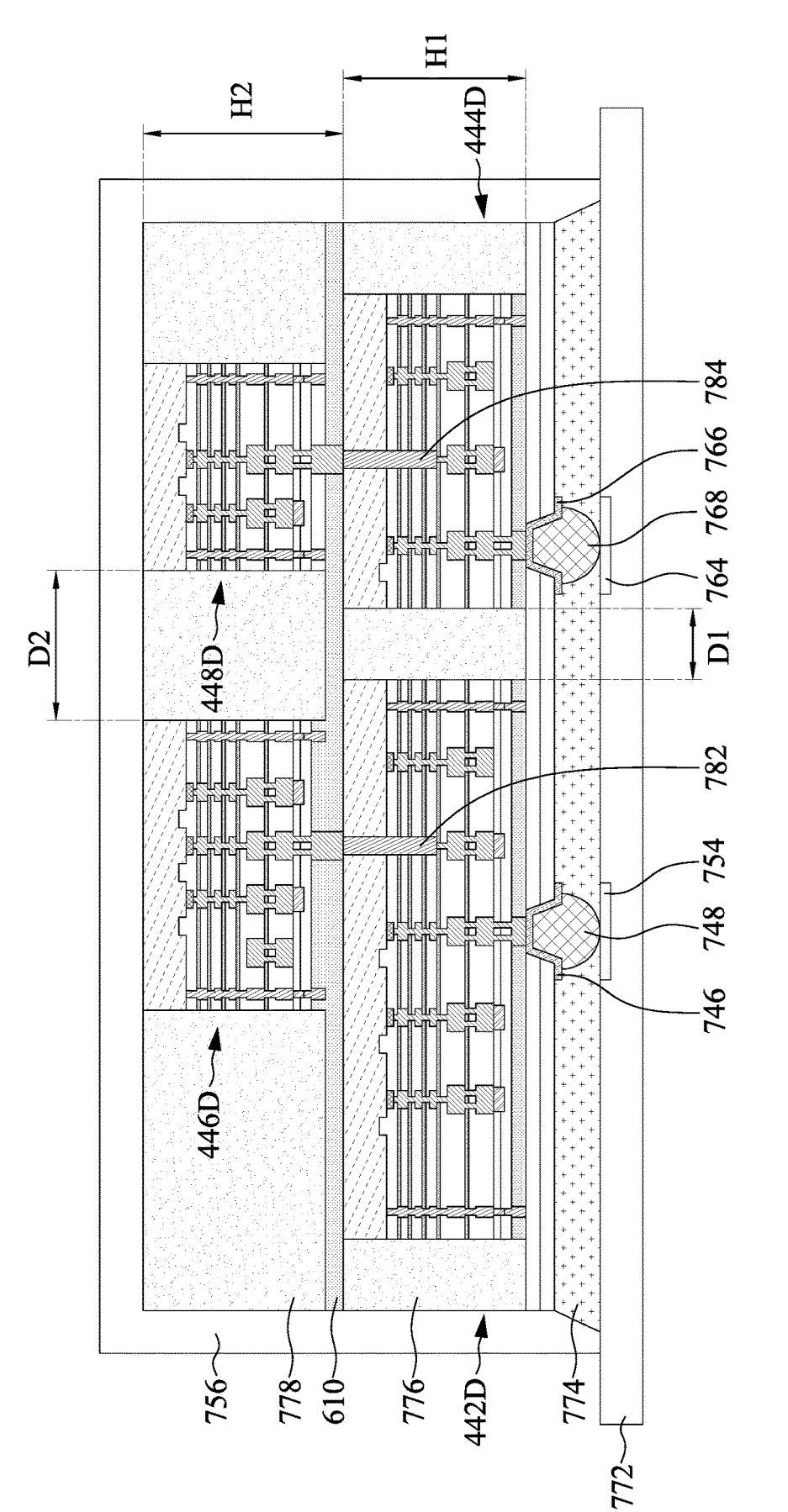
FIG. 4 is a schematic cross-sectional view of a semiconductor structure, in accordance with some embodiments.

FIG. 4 is a schematic cross-sectional view of a semiconductor structure 400, in accordance with some embodiments. In some embodiments, the semiconductor structure 400 is a 3DIC device, and shares many aspects with the semiconductor structure 100 (or the semiconductor die 714D) shown in FIG. 1Y. Thus, these similar aspects are not repeated for brevity. In some embodiments, the semiconductor structure 400 includes two tiers arranged in a die stack. For example, semiconductor dies 442D and 444D are arranged in a first tier and encapsulated by a dielectric material 776. The semiconductor dies 446D and 448D are arranged in the second tier and encapsulated by a dielectric material 778. The dielectric material 776 or 778 may include similar materials to the dielectric material 608 or 612. The first tier and the second tier are bonded through hybrid bonding with the bonding layer 610. The semiconductor dies 442D and 444D may be similar to the semiconductor die 104D, while the semiconductor dies 446D and 448D may be similar to the semiconductor die 704D. The semiconductor structure 400 further includes the substrate 772, which includes conductive pads 754 and 764. In some embodiments, the semiconductor dies 442D and 444D are bonded and electrically connected to the conductive pads 754, 764 of the substrate 772 through UBM layers 746, 766 and connectors 748, 768, respectively. In some embodiments, the semiconductor dies 442D and 444D are electrically connected to the semiconductor die 446D and 448D, through conductive vias 782, 784, respectively. Although the present embodiment illustrates only two tiers of the bonded semiconductor structure 400, the configuration of more than two tiers is also within the contemplated scope of the present disclosure.

In some embodiments, a molding underfill material 774 is used to encapsulate the connectors 748, 768. The molding underfill may include a polymer-based material, such as a liquid molding compound, epoxy, or other insulating material. A molding material 756 is employed to mold the semiconductor dies 442D, 444D, 446D and 448D, the substrate 772 and the connectors 748, 768. The relative step is shown in step S1018 of method 1000 and may be similar to the operations shown in FIG. 1Y. Further, the molding material 756 molds the dielectric materials 776 and 778, and the molding underfill material 774.

In some embodiments, a die spacing D1 between the semiconductor dies 442D and 444D or a die spacing D2 between the semiconductor dies 446D and 448D is greater than about 1 μm, e.g., between about 1 μm and about 1000 μm, or between about 3 μm and about 100 μm, e.g., 40 μm, or the like, to ensure an acceptable pick-and-place or gap-filling performance during the bonding operation or dispensing of the dielectric material 776 or 778. In some embodiments, a first height H1 of the first tier or a second height H2 of the second tier is in a range between about 1 μm and about 10000 μm, or between about 3 μm and about 50 μm, such as 20 μm, or the like. In some embodiments, a dimensional ratio D1/H1 or D2/H2 is between about 0.01 and about 100, or between about 0.1 and about 10, such as 2, or the like.

In some embodiments, at least one of the dielectric materials 608 and 612, or at least one of the dielectric materials 776 and 778, adopts a polymer-based material as the gap-fill material. As discussed previously, the polymer-based material, such as the epoxy molding compound, polyimide, PCB, PEEK, PES, PPS, polysiloxane, or the like, may aid in reduce the stress exerted on the semiconductor dies 104D, 704D, 442D, 444D, 446D and 448D. In some embodiments, at least one of the dielectric materials 608 and 612, or at least one of the dielectric materials 776 and 778, is different from the IMD layer 124, e.g., silicon oxide, or the etch stop layer 122, e.g., silicon nitride.

In some embodiments, in a multi-tier 3DIC device, not all of the dielectric materials 608 and 612, 776 and 778, adopts the polymer-based material. In some embodiments, when only one of the tiers, especially the topmost tier, of the multi-tier 3DIC device adopts the polymer-based material, the stress issue can be significantly relieved. Also, the adverse impact of the thermal expansion of the polymer-based material on the adjacent features can be reduced to the minimum, especially when the only polymer-based gap-filling material is arranged in the topmost tier of the 3DIC device. Under that situation, other lower tiers in the multi-tier 3DIC device may adopt the material of the IMD layer 124, e.g., silicon oxide, or the etch stop layer 122, e.g., silicon nitride, as the gap-filling material to save processing time and cost.

In some embodiments, when the ratio of CTE between the gap-filling dielectric material 608, 612, 776, 778 and the IMD layer 124 (or the etch stop layer 122) is between about two and about ten, or the like, such gap filling dielectric material is arranged in a topmost of the multi-tier 3DIC device, or arranged in a single-tier of a 3DIC device, to seek a balance between the effects of the stress and the thermal expansion caused by such material. The lower tiers of the multi-tier 3DIC device adopt silicon oxide as the gap-filling material. In some embodiments, when the ratio of CTE between the gap-filling dielectric material 608, 612, 776, 778 and the IMD layer 124 (or the etch stop layer 122) is between about one and about two, or the like, such gap filling dielectric material can be arranged in any tier of the multi-tier 3DIC device since the effect of the thermal expansion can be neglected.

Figures 5A, 5B, 5C:
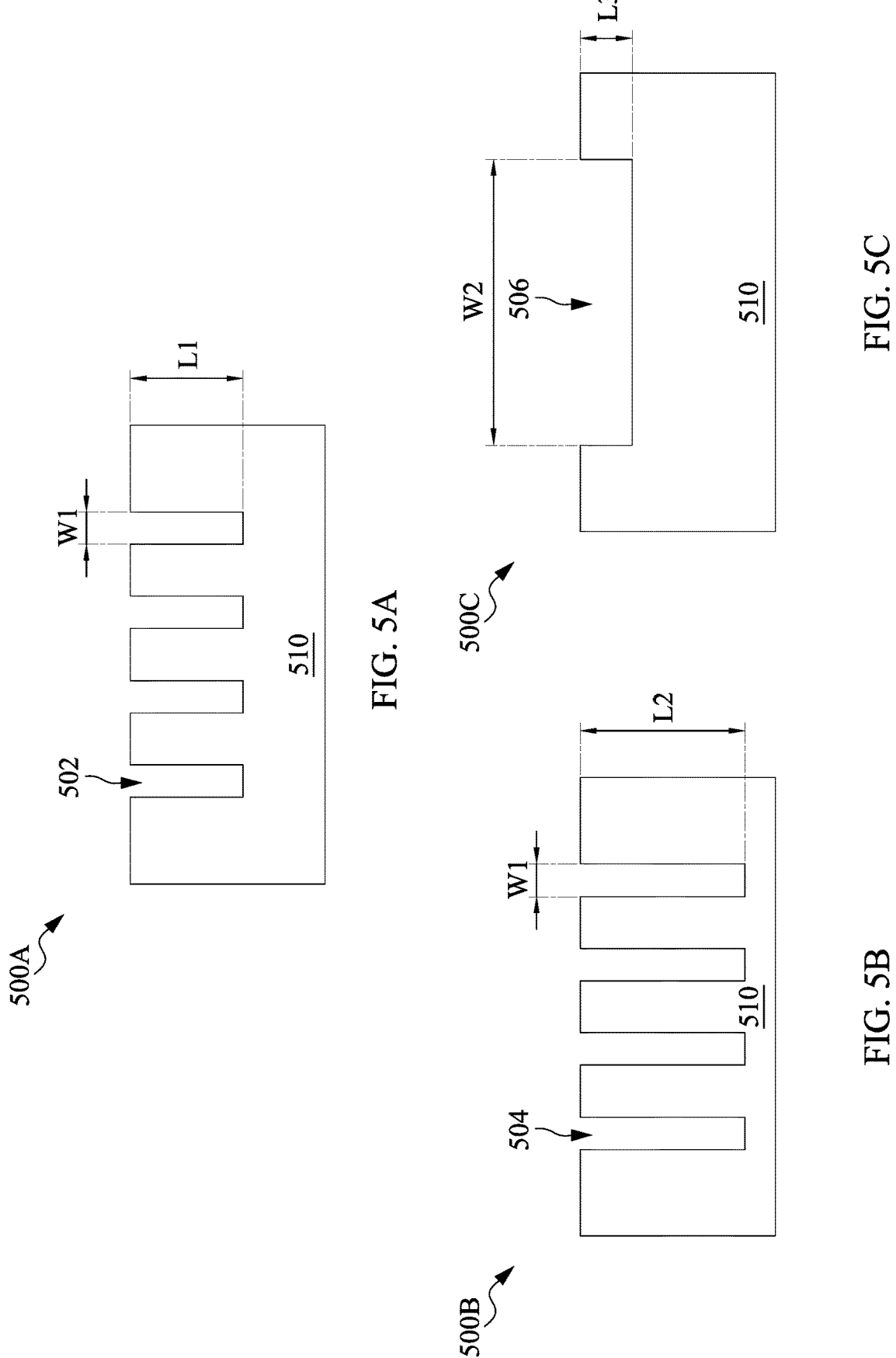
FIGS. 5A, 6A, and 7A are schematic cross-sectional views showing intermediate stages in a method of forming a semiconductor structure, in accordance with various embodiments of the present disclosure.
FIGS. 5B, 6B, and 7B are schematic cross-sectional views showing intermediate stages in a method of forming a semiconductor structure, in accordance with various embodiments of the present disclosure.
FIGS. 5C, 6C, and 7C are schematic cross-sectional views showing intermediate stages in a method of forming a semiconductor structure, in accordance with various embodiments of the present disclosure.
Figures 6A, 6B, 6C:
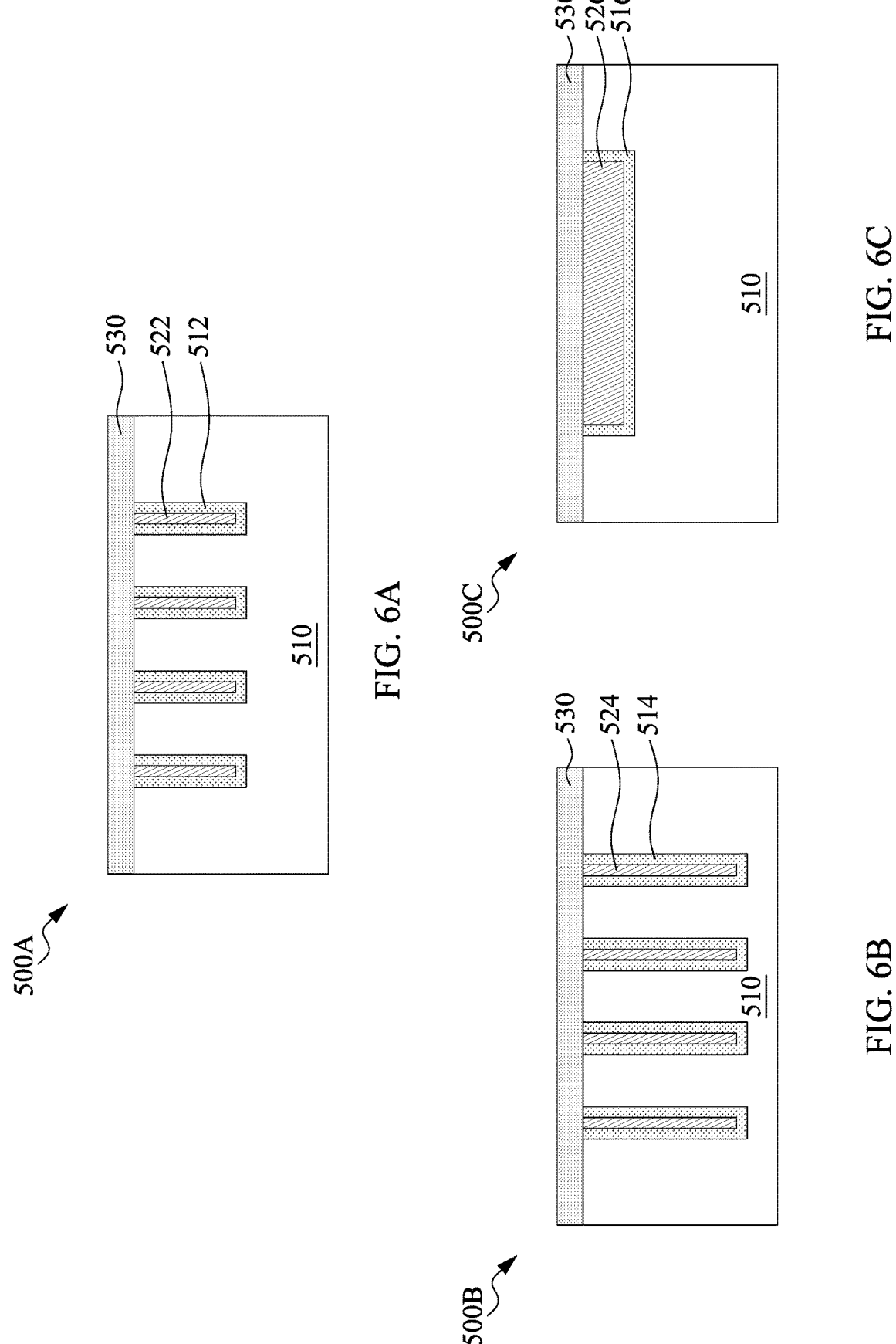
Figures 7A, 7B, 7C:
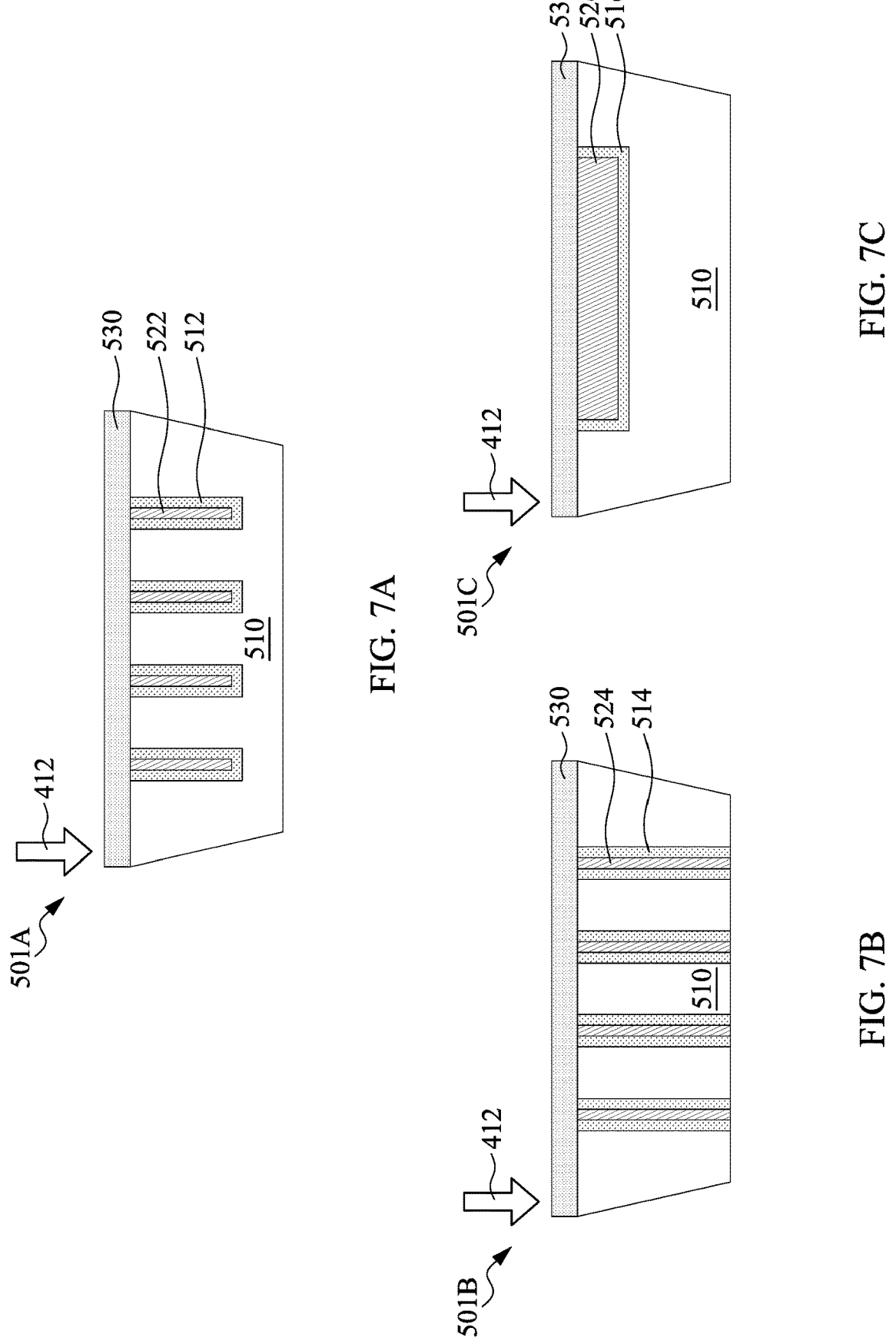

FIGS. 5A, 6A and 7A are schematic cross-sectional views showing intermediate stages in a method of forming a semiconductor structure 500A, in accordance with various embodiments of the present disclosure. FIGS. 5B, 6B and 7B are schematic cross-sectional views showing intermediate stages in a method of forming a semiconductor structure 500B, in accordance with various embodiments of the present disclosure. FIGS. 5C, 6C and 7C are schematic cross-sectional views showing intermediate stages in a method of forming a semiconductor structure 500C, in accordance with various embodiments of the present disclosure. In some embodiments, the semiconductor structures 500A, 500B or 500C are referred to as a dummy die.

Referring to FIGS. 5A, 5B, and 5C, a semiconductor substrate 510 is provided or received for each of the semiconductor structures 500A to 500C. The semiconductor substrate 510 includes a material similar to the semiconductor substrate 104. Various patterning operations are performed on the surfaces of the semiconductor substrates 510 to form trenches. Referring to FIG. 5A, a plurality of trenches 502 are etched from the upper surface of the semiconductor substrates 510. The trench 502 may have a width W1 from a cross-sectional view and a depth L1. Referring to FIG. 5B, a plurality of trenches 504 are etched from the upper surface of the semiconductor substrates 510. The trench 504 may have a width W2 from a cross-sectional view and a depth L2. Referring to FIG. 5C, a trench 506 is etched from the upper surface of the semiconductor substrates 510. The trench 506 may have a width W3 from a cross-sectional view and a depth L3. In some embodiments, the depth L2 is greater than the depth L1, and the depth L1 is greater than the depth L3. In some embodiments, the width W3 is greater than the widths W1 and W2. In some embodiments, the widths W1 and W2 are substantially equal or different. The trenches 502, 504, 506 may be formed by an etching operation, such as a dry etch, a wet etch, a combination thereof, or the like.

Referring to FIGS. 6A, 6B, and 6C, conductive members are formed in the trenches 502, 504, and 506. Initially, an isolation layer 512, 514 or 516 is deposited on the sidewalls and bottoms of the trenches 502, 504 or 506, respectively. The isolation layer 512, 514 or 516 may be formed of a dielectric material, such as silicon oxide or silicon nitride, and deposited using CVD, PVD, ALD, or other suitable deposition methods.

A conductive material fills the trenches 502, 504 and 506 over the isolation layer 512, 514 and 516 to form conductive vias 522 in the trench 502, conductive vias 524 in the trenches 504, and a conductive layer 526 in the trench 506. The conductive material may include copper, tungsten, aluminum, titanium, or other suitable conductive materials. The conductive material may be deposited in the trenches 502, 504 and 506 using CVD, PVD, ALD, plating or other suitable methods. In some embodiments, the conductive vias 522, 524 are referred to as the TSV.

A bonding layer 530 is deposited over each of the semiconductor structures 500A to 500C. The bonding layer 530 covers the upper surface of the semiconductor substrate 510 in each of the semiconductor structures 500A to 500C. The bonding layer 530 may include a material similar to the bonding layer 170, e.g., silicon oxide.

Referring to FIG. 7A to FIG. 7C, a thinning operation is performed on the backsides of the semiconductor substrates 510 opposite to the conductive vias 522, 524 and the conductive layer 526. A planarization tool 404 is introduced to perform the thinning operation. In some embodiments, CMP is employed to perform the thinning operation. In some embodiments, the semiconductor substrate 510 has a thickness between the thickness T4 and the thickness T2, discussed above. In some embodiments, the bottoms of the conductive vias 522 and the conductive layer 526 are covered by the respective semiconductor substrates 510. In some embodiments, the conductive vias 524 extend through the semiconductor substrate 510, and the bottoms of the conductive vias 524 are exposed through the backside of the semiconductor substrate 510.

A dicing operation or a singulation operation is performed on the semiconductor substrates 510 to form individual semiconductor dies 501A, 501B, and 501C from the semiconductor structures 500A, 500B and 500C, respectively. In some embodiments, the semiconductor substrate 510 is arranged on a dicing tape, such as a back-grinding (BG) tape. A cutting tool 412, e.g., a dicing blade or a dicing laser beam, is utilized to separate the semiconductor structures 500A, 500B and 500C into individual semiconductor dies 501A, 501B and 501C.

Figure 8A:
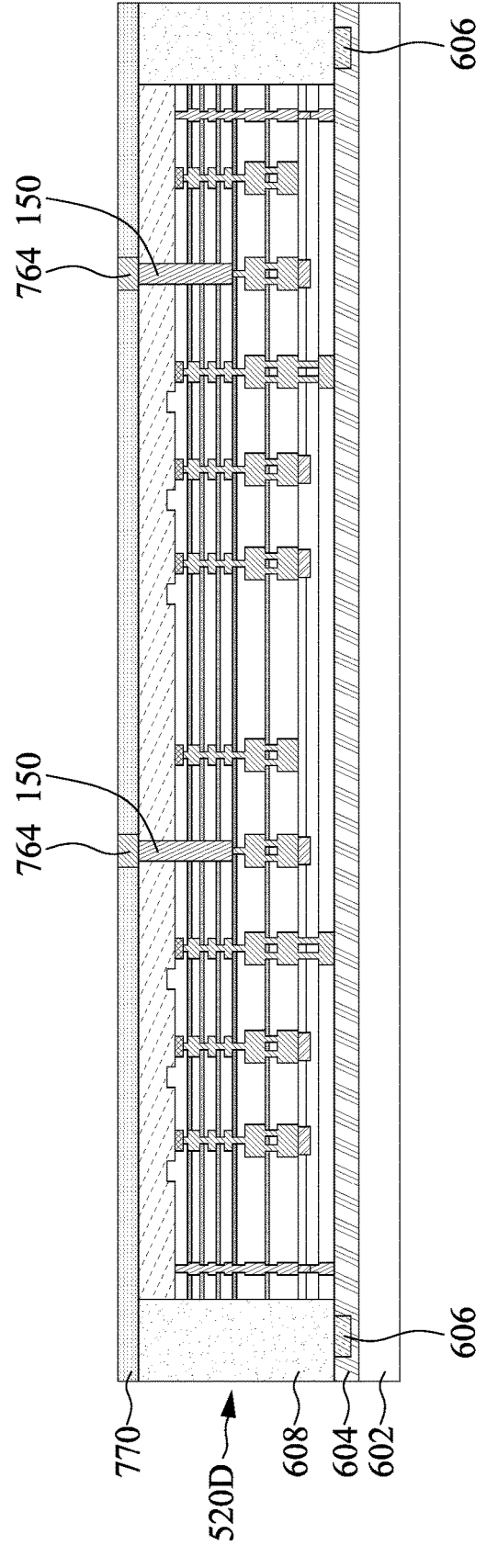
FIGS. 8A, 8B, and 8C are schematic cross-sectional views showing various stages in a method of forming a semiconductor structure, in accordance with various embodiments of the present disclosure.
Figure 8B:
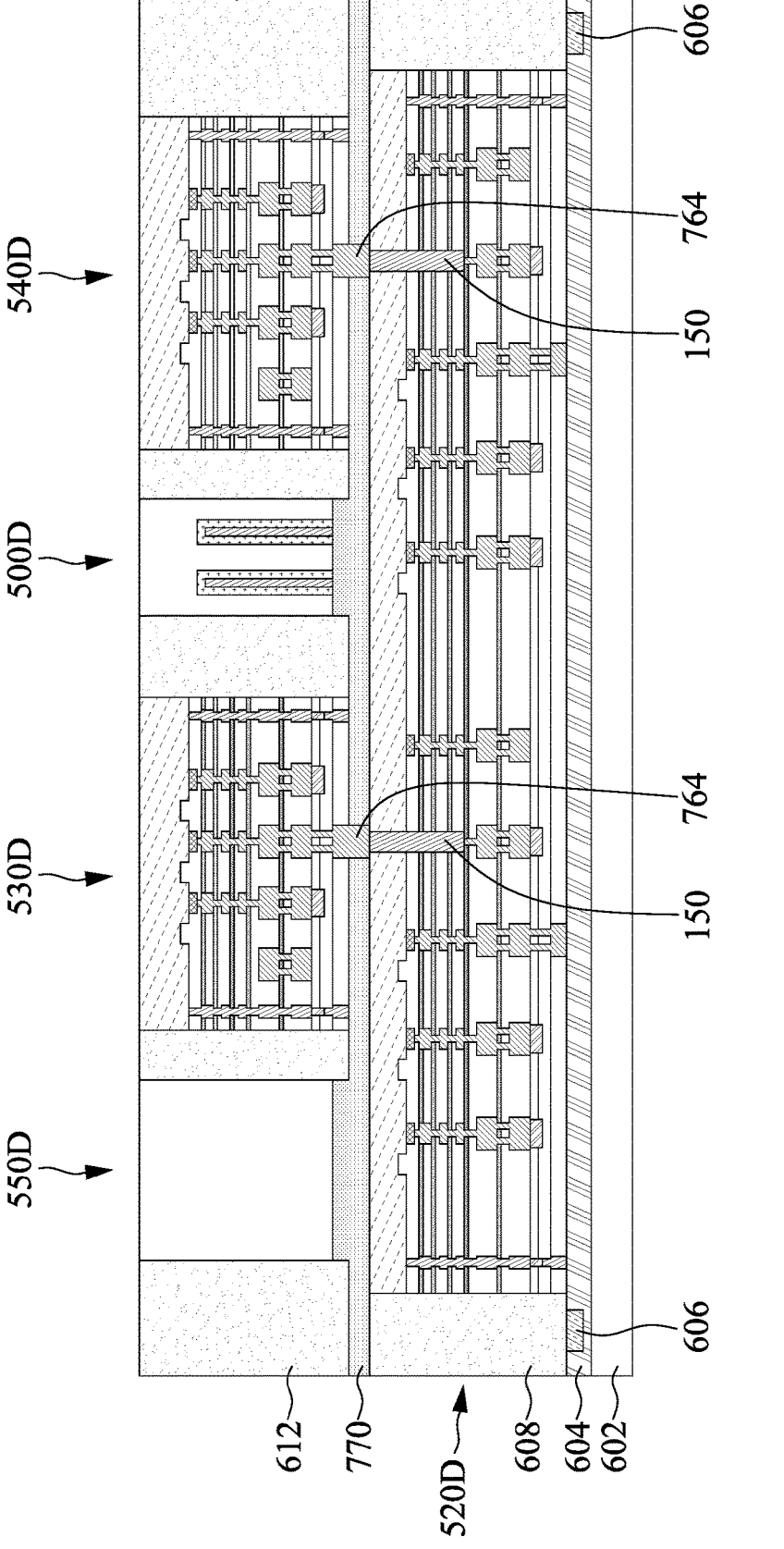
Figure 8C:
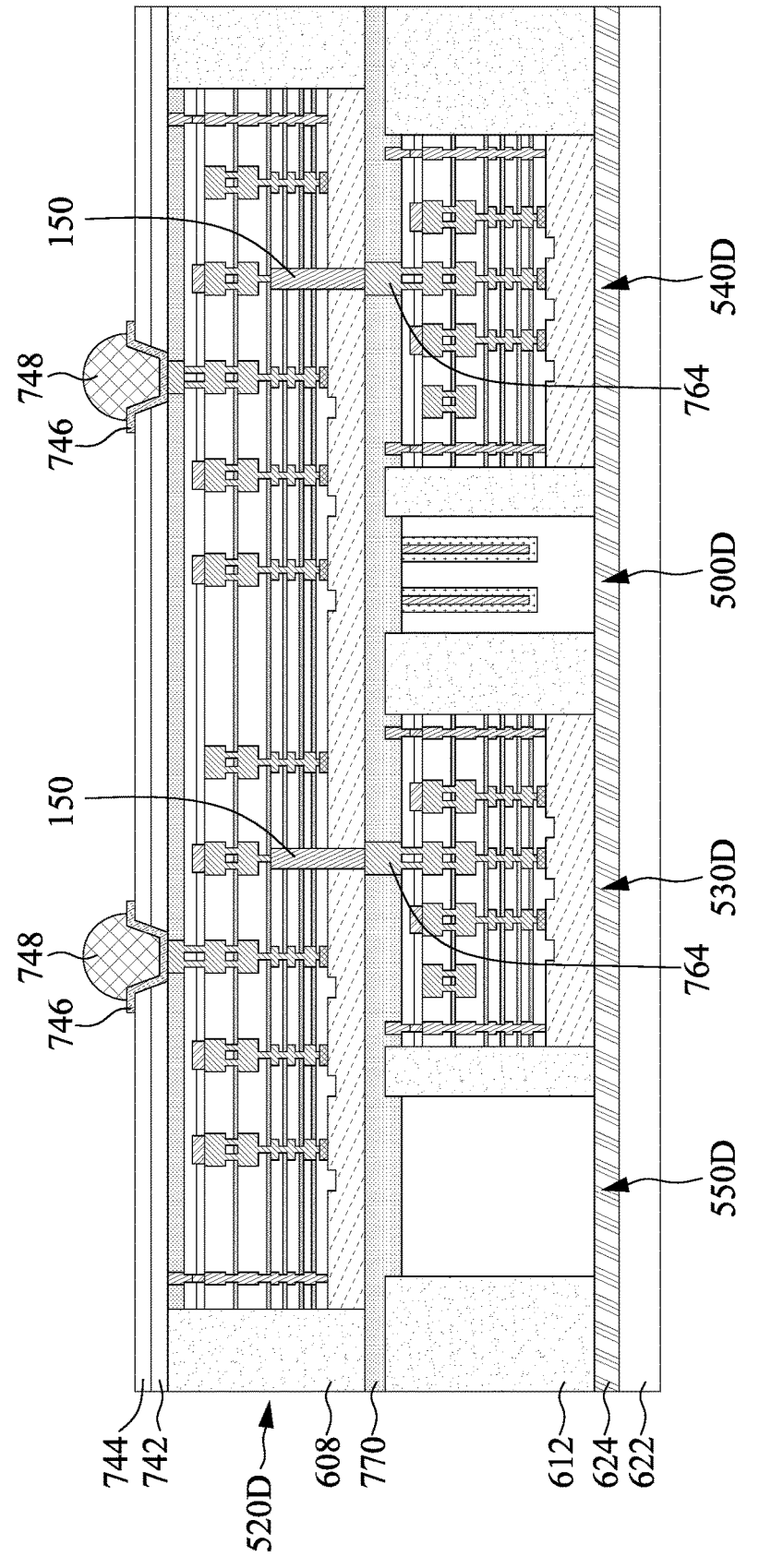

FIGS. 8A, 8B, and 8C are schematic cross-sectional views showing various stages in a method of forming a semiconductor structure 800, in accordance with various embodiments of the present disclosure. Referring to FIG. 8A, a semiconductor structure 800 is shown, in which a semiconductor die 520D, which is similar to the semiconductor die 104D or 704D, is formed in a first tier on the carrier substrate 602 and bonded to the marking layer 604. The formation of the first tier of the semiconductor structure 800 is similar to the operations shown in FIGS. 1A to 1L. In some embodiments, the semiconductor die 520D includes two conductive vias 150. The semiconductor die 520D is molded or encapsulated by the gap-filling dielectric material 608.

A bonding layer 770 is deposited over the first tier, in a manner similar to the formation of the bonding layer 610 as shown in FIG. 1P. In some embodiments, the bonding layer 770 includes two conductive pads 764 electrically connected to the respective conductive vias 150.

Referring to FIG. 8B, several semiconductor dies are provided in the second tier and bonded to the bonding layer 770, in a manner similar to the operations shown in FIGS. 1Q to 1T. The semiconductor dies are molded or encapsulated by the gap-filling dielectric material 612. In some embodiments, semiconductor dies 530D and 540D are bonded to the semiconductor die 520D through hybrid bonding. The semiconductor dies 530D and 540D may be similar to the semiconductor die 104D or 704D. The semiconductor dies 530D and 540D includes respective conductive pads (not separately labeled) electrically connected to the semiconductor die 520D through the conductive pads 764 of the bonding layer 770.

In some embodiments, a semiconductor die 500D, which may be one of the semiconductor dies 501A, 501B and 501C shown in FIGS. 7A to 7C, is arranged adjacent to the semiconductor dies 530D or 540D and bonded to the bonding layer 770. In some embodiments, the semiconductor die 500D is electrically insulated from other semiconductor dies 520D, 530D and 540D, through the bonding layer 530 and/or 770, and the gap-filling material 612, and thus the semiconductor die 500D is referred to as a dummy die. In some embodiments, the silicon material of the semiconductor substrate 510, the conductive material in the conductive vias 522, 524 or the conductive layer 526 provides additional paths for conducting heat generated by the semiconductor dies 520D, 530D and 540D.

In some embodiments, a semiconductor die 550D is arranged adjacent to the semiconductor dies 530D or 540D and bonded to the bonding layer 770. In some embodiments, the semiconductor die 550D is electrically insulated from other semiconductor dies 520D, 530D and 540D, through the bonding layer 530 formed thereon, the bonding layer 770, and the gap-filling material 612, and thus the semiconductor die 550D is referred to as a dummy die. In some embodiments, the semiconductor die 550D is formed of bulk silicon or other elementary elements. The silicon elements of the semiconductor die 550D provides an additional path for conducting heat generated by the semiconductor dies 520D, 530D and 540D.

Referring to FIG. 8C, UBM layers 746 are formed on the frontside of the semiconductor die 550D. The connectors 748 are mounted on the frontside of the semiconductor die 550D through the UBM layers 746, in a manner similar to the operations shown in FIGS. 1V and 1W.

Figure 10:
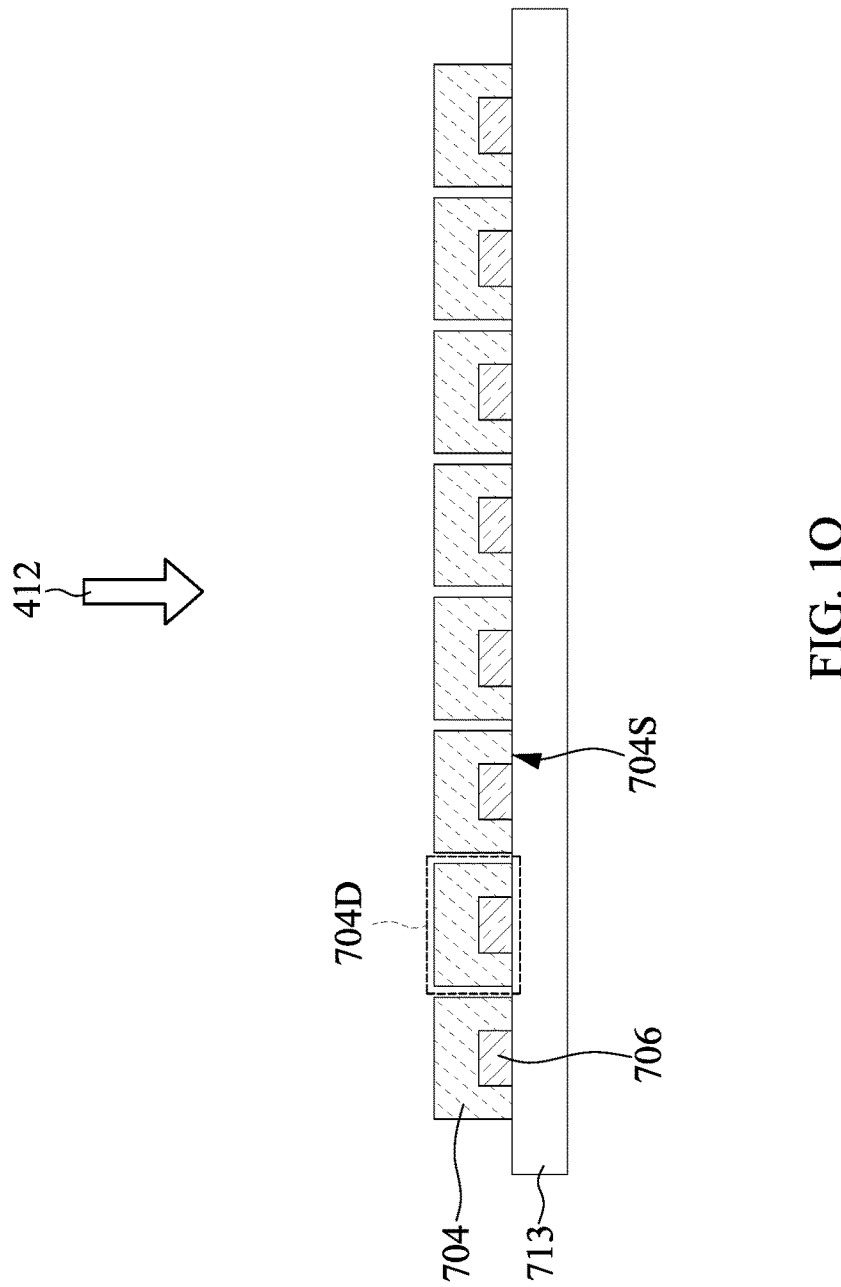
FIG. 10 is a schematic flowchart of a method of manufacturing the semiconductor structure shown in FIGS. 9A to 9I, in accordance with some embodiments.

FIGS. 9A to 9I are schematic cross-sectional views showing various stages in a method of forming a semiconductor structure 900 (shown in FIG. 9I), in accordance with various embodiments of the present disclosure. In some embodiments, the semiconductor structure 900 is a 3DIC die. FIG. 10 shows a schematic flowchart of a method 1000 of manufacturing the semiconductor structure 900, in accordance with some embodiments. It shall be understood that additional steps can be provided before, during, and after the steps in method 1000, and some of the steps described below can be replaced with other embodiments or eliminated. The order of the steps may be interchangeable. Some of the steps may be performed concurrently or independently.

Figure 9A:
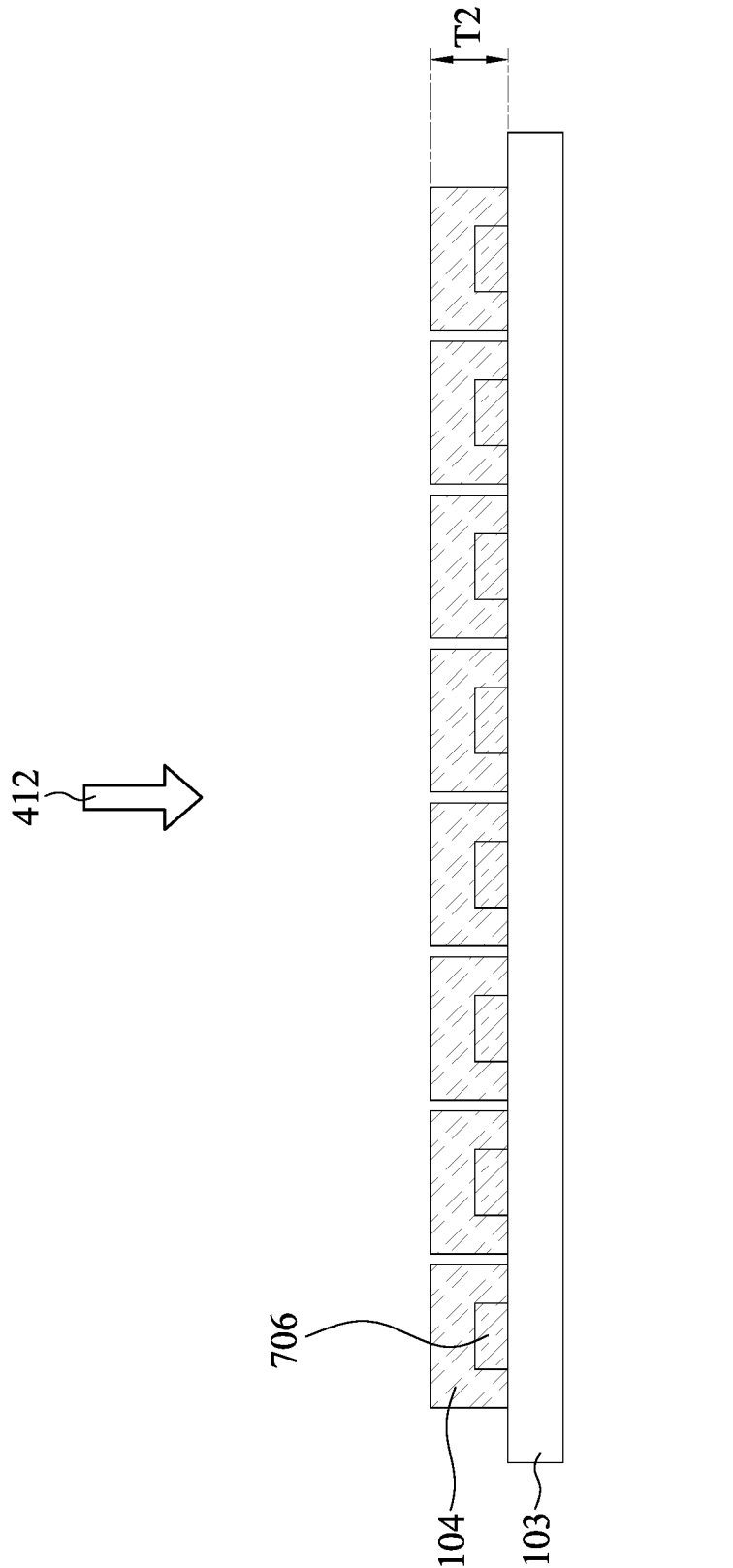

Referring to FIG. 9A, a semiconductor substrate 104 including a plurality of semiconductor devices 106 is arranged on a dicing tape 103. A dicing operation is performed to form individual semiconductor dies 104D by a dicing tool 412. The relative step is shown in steps S202 through 208 of method 200 or 1000.

Figure 9B:
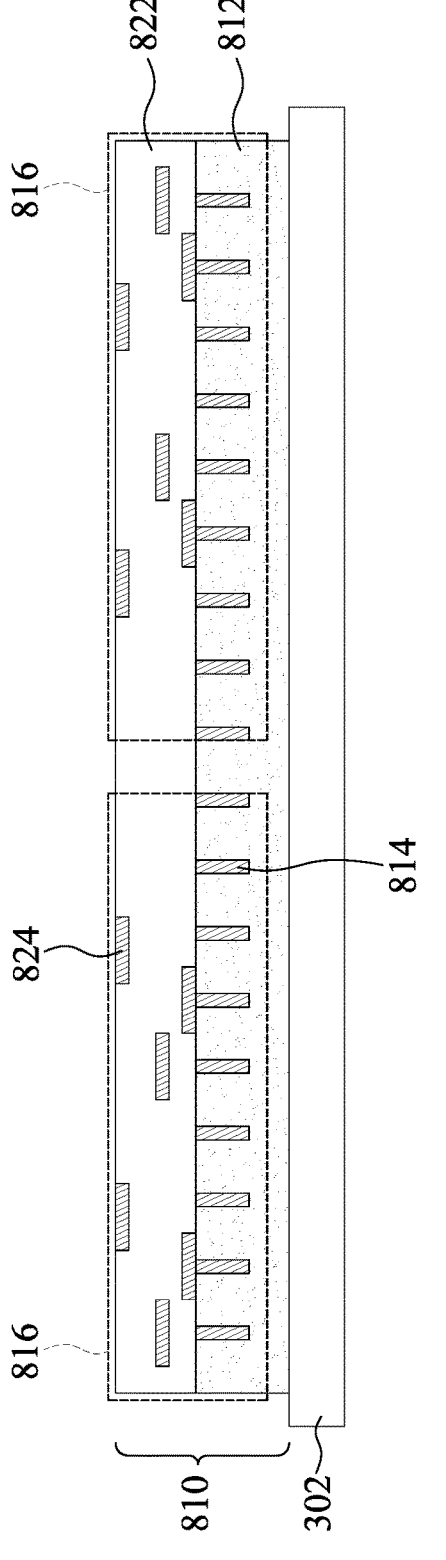

Referring to FIG. 9B, a carrier substrate 302 is provided or received and includes a semiconductor structure 901. The carrier substrate 302 may include a material similar to the carrier substrate 102. A semiconductor substrate 810 is provided over the carrier substrate 302. The semiconductor substrate 810 may be formed to define a plurality of interposer devices 816, and may be referred to as an interposer substrate. The relative step is shown in step S1002 of method 1000. In some embodiments, the semiconductor substrate 810 or each of the interposer devices 816 includes a substrate layer 812 and an interconnect structure 822 over the substrate layer 812. In some embodiments, the substrate layer 812 is formed of a semiconductor substrate. The substrate layer 812 may include a material similar to the semiconductor substrate 104. In some embodiments, conductive vias 814 are formed in the substrate layer 812. The conductive vias 814 may be referred to as TSVs, and the materials and method of formation for the conductive vias 814 are similar to those of the conductive vias 522 or 524.

In some embodiments, the interconnect structure 822 is similar to the interconnect structure 120 and includes metal members, such as metal lines 824 and metal vias (not separately shown), to establish interconnection routes to electrically interconnect the conductive vias 814. The materials, configurations and methods of forming for the interconnect structure 822 may be similar to those of the interconnect structure 120, and thus the similar features are not repeated herein for brevity.

Referring to FIG. 9C, the semiconductor dies 104D are bonded to the semiconductor substrate 810. The relative step is shown in steps S1004 of method 1000. In some embodiments, the semiconductor dies 104D are bonded to the corresponding interposer devices 816 of the interconnect structure 822 through hybrid bonding. In some embodiments, the oxide material of the interconnect structure 822 is bonded to the oxide material of the bonding layer 170 (see FIG. 1G) through fusion bonding, while the conductive pads on the front side of the semiconductor dies 104D is bonded to the metal lines 824 of the interconnect structure 822 to form metallic bonds.

Figure 9D:

Referring to FIG. 9D, a first thinning operation is performed on the individual semiconductor dies 104D. The relative step is shown in step S1006 of method 1000 and may be similar to the operation shown in FIG. 1H. The planarization tool 402 may be introduced to perform the first thinning operation. The planarization tool 402 may be utilized to remove a thickness of the semiconductor substrate 104 of the semiconductor die 104D from the backside of the semiconductor substrate 104. The first thinning operation may include mechanical grinding. In some embodiments, CMP is employed to perform the first thinning operation. In some embodiments, the semiconductor die 104D has the thickness T3, previously discussed.

FIG. 9E illustrates the filling of the dielectric material 608. The relative step is shown in step S1008 of method 1000 and may be similar to the operation shown in FIG. 1K. The dielectric material 608 serves as a gap-filling material to fill the gaps between the semiconductor dies 104D. In some embodiments, a portion of the dielectric material 608 extends over the semiconductor dies 104D.

A second thinning operation is performed on the semiconductor dies 104D and the dielectric material 608. The relative step is shown in step S1010 of method 1000 and may be similar to the operation shown in FIG. 1L. The semiconductor dies 104D is further thinned down from backsides thereof through the second thinning operation. In addition, the excess material of the dielectric material 608 is also removed. After the second thinning operation, the upper surface of the dielectric material 608 is level with the upper surfaces of the semiconductor dies 104D. Through the second thinning operation, the semiconductor dies 104D is thinned to the thickness T4, previously discussed.

Figure 9F:
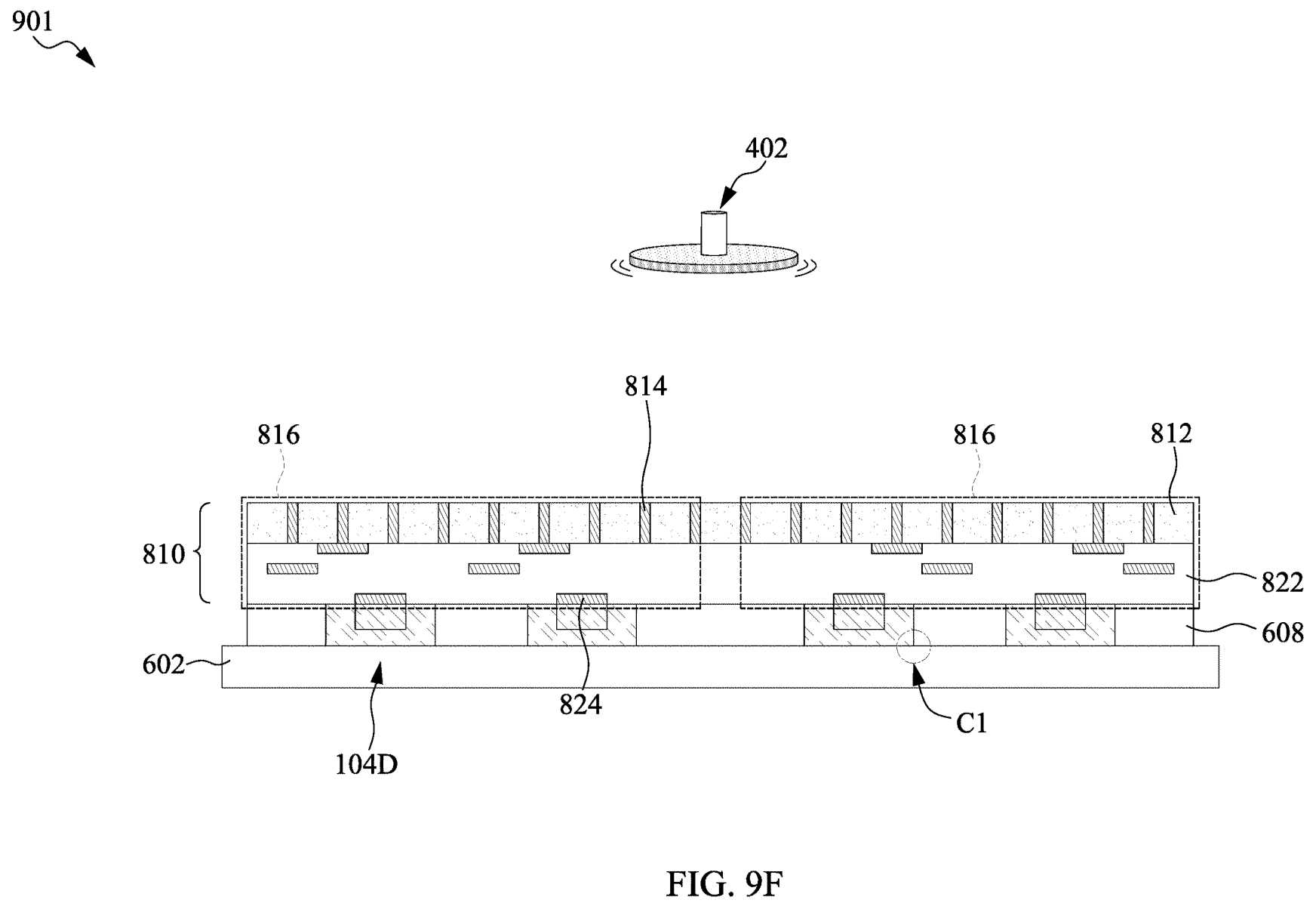

Referring to FIG. 9F, a carrier substrate 602 is formed over the semiconductor dies 104D and the dielectric material 608. The carrier substrate 602 may include similar material to the carrier substrate 102. The semiconductor structure 901 is flipped, and the carrier substrate 302 is removed from the semiconductor substrate 810.

A third thinning operation is performed on the semiconductor substrate 810. The relative step is shown in step S1012 of method 1000. A planarization tool 402 is introduced to remove excessive materials of the substrate layer 812. The backside of the semiconductor substrate 810 and the bottom surfaces of the conductive vias 814 are exposed accordingly. In some embodiments, CMP is employed to perform the third thinning operation.

Referring to FIG. 9G, connectors 832 are mounted to the backside of the semiconductor substrate 810. The relative step is shown in step S1014 of method 1000 and may be similar to the operations shown in FIGS. 1V and 1W. In some embodiments, UBM layers (not shown) are formed on the backside of the semiconductor substrate 810, and the connectors 832 are mounted to the semiconductor substrate 810 through the UBM layers. In some embodiments, the connectors 832 are similar to the connectors 748 and include a solder material.

Figure 9H:
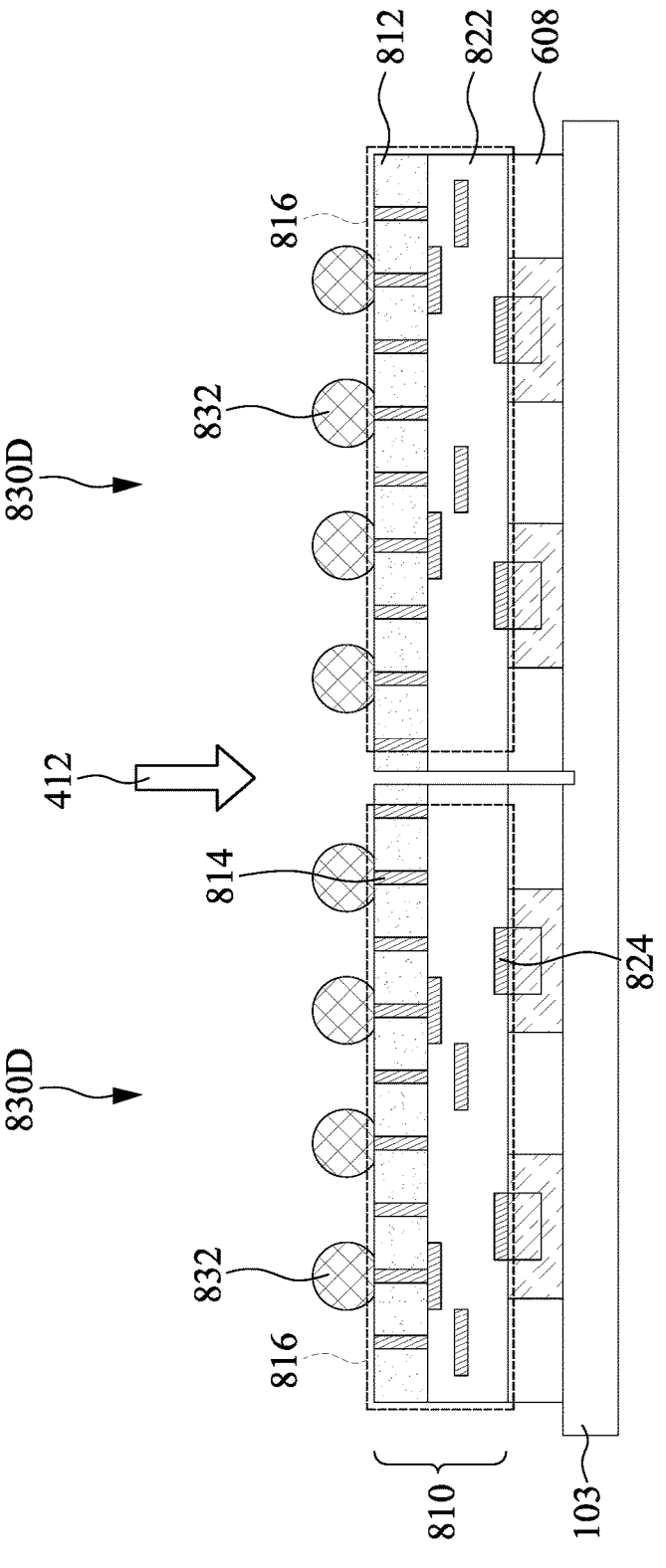

Referring to FIG. 9H, a dicing operation or a singulation operation is performed on the bonded semiconductor structure 901. The relative step is shown in step S1016 of method 1000 and may be similar to the operations shown in FIG. 1X. The semiconductor structure 901 is arranged on a dicing tape 103, such as a BG tape. A cutting tool 412, e.g., a dicing blade or a dicing laser beam, is utilized to separate the semiconductor structure 901 into individual semiconductor dies 830D. In each of the semiconductor dies 830D, an interposer device 816 is bonded and electrically connected to two semiconductor dies 104D according to some embodiments of the present disclosure.

Figure 9I:
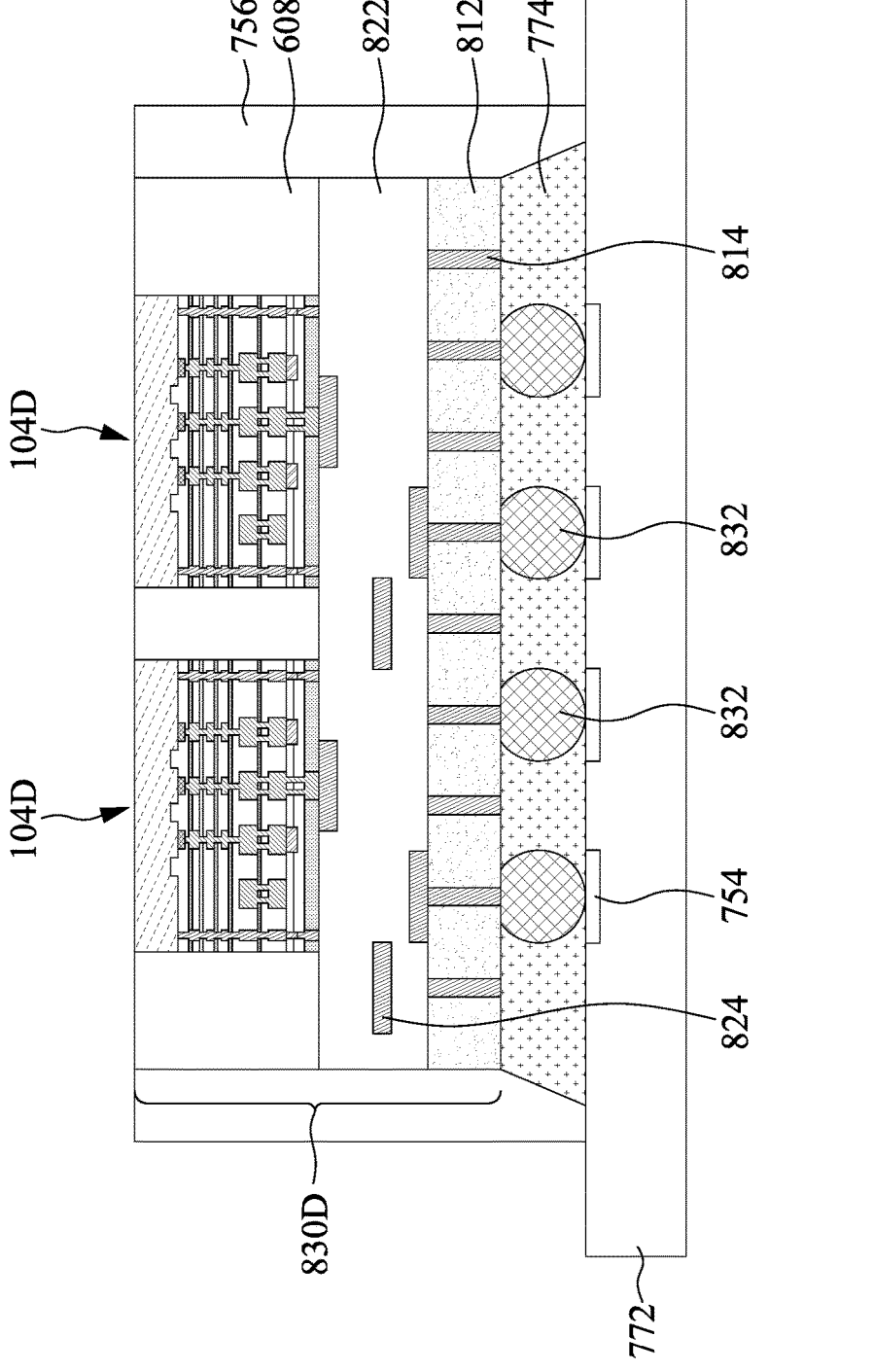

Referring to FIG. 9I, each of the semiconductor dies 830D is bonded to a substrate 772. The substrate 772 may include an interconnection structure including conductive pads 754. The semiconductor die 830D is bonded and electrically connected to the substrate 772 through the bonding of the connector 832 to the conductive pad 754.

In some embodiments, a molding underfill material 774 is used to encapsulate the connectors 832. The molding underfill may include a polymer-based material, such as a liquid molding compound, epoxy, or other insulating material. A molding material 756 is employed to mold the semiconductor die 830D, the substrate 772 and the connectors 832. The relative step is shown in step S1018 of method 1000 and may be similar to the operations shown in FIG. 1Y. Further, the molding material 756 molds the components of the semiconductor die 830D, e.g., the semiconductor dies 104D, the interposer device 816, the dielectric materials 608, and the molding underfill material 774.

According to an embodiment, a method of manufacturing a semiconductor structure is provided. A plurality of first semiconductor dies are formed from a first substrate, wherein each of the first semiconductor die includes an interconnect structure having a first dielectric material. A plurality of second semiconductor dies are formed from a second substrate. The first semiconductor dies are bonded to a third substrate through a first bonding film. A first thinning operation is performed on each of the first semiconductor dies from a backside thereof subsequent to the bonding of the first semiconductor dies. A first gap between the first semiconductor dies is filled with a second dielectric material. The second semiconductor dies are bonded to the first semiconductor dies through a second bonding film, wherein each of the first semiconductor dies is electrically connected to each of the corresponding second semiconductor dies. A second gap between the second semiconductor dies is filled with a third dielectric material, wherein at least one of the second and third dielectric materials is different from the first dielectric material.

According to an embodiment, a method of manufacturing a semiconductor structure is provided. A first semiconductor die is formed from a first substrate, wherein the first semiconductor die includes an interconnect structure having conductive members and a first dielectric material surrounding the conductive members. The first semiconductor die is bonded to a second substrate. A first thinning operation is performed on the first semiconductor die from a backside thereof, wherein the first thinning operation causes a chipped area on the first semiconductor die. The first semiconductor die is laterally surrounded, and the chipped area is filled with, a second dielectric material different from the first dielectric material, wherein a ratio of coefficients of thermal expansion (CTE) between the second dielectric material to the first dielectric material is between about one and about two, or the like. A second semiconductor die is formed from a third substrate. A bonding layer is deposited on the first semiconductor die. The second semiconductor die is bonded to the first semiconductor die by causing a surface of the first semiconductor die to contact the bonding layer. The first and second semiconductor dies are molded with a molding material.

According to an embodiment, a semiconductor structure includes a first die and a second die. The first includes a first substrate, a first interconnect structure over the first substrate, wherein the first interconnect structure includes a first conductive member and a first dielectric material, and a second dielectric material laterally surrounding the first substrate and the first interconnect structure. The semiconductor structure also includes a bonding layer disposed over the first die. The second die is disposed over the bonding layer and includes: a second substrate, a second interconnect structure over the second substrate, wherein the second interconnect structure includes a second conductive member and a third dielectric material; and a fourth dielectric material laterally surrounding the second substrate and the second interconnect structure. The semiconductor structure further includes a molding material surrounding the first die, the bonding layer and the second die, and a solder bump electrically connected to the first die. At least one of the second and fourth dielectric materials is different from the first dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, comprising:

forming a plurality of first semiconductor dies from a first substrate, each of the plurality of first semiconductor dies including an interconnect structure having a first dielectric material;

forming a plurality of second semiconductor dies from a second substrate;

bonding a frontside of the plurality of first semiconductor dies to a third substrate through a first bonding film, wherein the first bonding film includes a non-conductive material that interfaces an entirety of the frontside of the plurality of first semiconductor dies;

after bonding the plurality of first semiconductor dies to the third substrate, performing a first thinning operation to a backside of each of the first semiconductor dies;

filling a first gap between adjacent ones of the first semiconductor dies with a second dielectric material;

bonding the plurality of second semiconductor dies to the plurality of first semiconductor dies through a second bonding film, each of the plurality of first semiconductor dies electrically connected to one of the plurality of second semiconductor dies; and filling a second gap between adjacent ones of the second semiconductor dies with a third dielectric material, wherein at least one of the second and third dielectric materials is different from the first dielectric material.

2. The method according to claim 1, wherein the first dielectric material includes silicon oxide.

3. The method according to claim 1, wherein the at least one of the second and third dielectric materials includes a coefficient of thermal expansion (CTE) less than twice of that of the first dielectric material.

4. The method according to claim 3, wherein the at least one of the second and third dielectric materials includes a polymer-based material.

5. The method according to claim 1, wherein the bonding of the plurality of first semiconductor dies to the third substrate comprises performing a fusion bonding process by forming silicon-oxygen bonds between the first bonding film and the third substrate.

6. The method according to claim 1, wherein the bonding of the plurality of second semiconductor dies to the plurality of first semiconductor dies comprises forming metallic bonds and silicon-oxygen bonds between the second bonding film and the plurality of second semiconductor dies.

7. The method according to claim 1, further comprising performing a dicing operation after filling the second gap.

8. The method according to claim 1, wherein the second bonding film includes oxide and has a first surface and a second surface opposite the first surface, wherein the second surface contacts an entirety of each of an upper surface of the plurality of first semiconductor dies, and wherein the first surface contacts an entirety of each of a lower surface of the plurality of second semiconductor dies.

9. The method according to claim 1, wherein the first thinning operation generates a chipped area on a corner of at least one of the first semiconductor dies, and wherein the second dielectric material fills the chipped area.

10. The method according to claim 1, further comprising:
removing the first bonding film from the plurality of first semiconductor dies; and
mounting a solder bump to each of the plurality of first semiconductor dies on a surface of the plurality of first semiconductor dies opposite the second bonding film.

11. A method of forming a semiconductor structure, comprising:
forming a first semiconductor die from a first substrate, the first semiconductor die including an interconnect structure having conductive members and a first dielectric material surrounding the conductive members;
bonding a frontside of the first semiconductor die to a second substrate using a non-conductive material that interfaces an entirety of the frontside of the first semiconductor die;
performing a first thinning operation to a backside of the first semiconductor die, wherein the first thinning operation creates a chipped area on the first semiconductor die;
surrounding the first semiconductor die laterally and filling the chipped area with a second dielectric material different from the first dielectric material, wherein a ratio of coefficients of thermal expansion (CTE) between the second dielectric material to the first dielectric material is between about one and about two;
forming a second semiconductor die from a third substrate;
depositing a bonding layer on the first semiconductor die;
bonding the second semiconductor die to the first semiconductor die by contacting a surface of the second semiconductor die to the bonding layer; and
molding the first and second semiconductor dies with a molding material.

12. The method according to claim 11, wherein the second dielectric material includes at least one of an epoxy molding compound and polyimide.

13. The method according to claim 12, wherein the second dielectric material is the same as the molding material.

14. The method according to claim 11, further comprising performing a second thinning operation on the first semiconductor die after the surrounding the first semiconductor die with the second dielectric material.

15. The method according to claim 11, further comprising bonding a third semiconductor die to the first semiconductor die adjacent to the second semiconductor die, wherein the third semiconductor die is electrically insulated from the first and second semiconductor dies.

16. The method according to claim 11, wherein the bonding of the second semiconductor die to the first semiconductor die causes a conductive pad of the second semiconductor die to be electrically connected to a through-silicon via of the first semiconductor die.

17. The method according to claim 11, wherein the second dielectric material includes an organic polymer with embedded inorganic fillers.

18. A method, comprising:
providing a semiconductor substrate including a plurality of interposer devices, wherein the plurality of interposer devices include a substrate layer and an interconnect structure over the substrate layer, and wherein the interconnect structure includes a dielectric material;
bonding front sides of a plurality of semiconductor die to the plurality of interposer devices;
performing a first thinning operation to a backside of the plurality of semiconductor die;
depositing a gap-filling material to fill one or more gaps between adjacent semiconductor die of the plurality of semiconductor die;
performing a second thinning operation to the backside of the plurality of semiconductor die, wherein after the second thinning operation, the backside of the plurality of semiconductor die is level with a top surface of the gap-filling material;
after performing the second thinning operation, attaching a carrier substrate to the backside of the plurality of semiconductor die and the top surface of the gap-filling material; and
performing a third thinning operation to the interconnect structure of the plurality of interposer devices to expose conductive vias of the interconnect structure;
wherein the gap-filling material has a different composition than the dielectric material.

19. The method according to claim 18, wherein the gap-filling material has a coefficient of thermal expansion (CTE) greater than that of the dielectric material.

20. The method according to claim 18, further comprising:
after performing the second thinning operation, performing a singulation operation to form a plurality of individual semiconductor die that each include an interposer device, of the plurality of interposer devices, and at least two semiconductor die, of the plurality of semiconductor die, bonded and electrically connected to the interposer device.

* * * * *